US007436188B2

(12) United States Patent
Taenzer

(10) Patent No.: US 7,436,188 B2
(45) Date of Patent: Oct. 14, 2008

(54) SYSTEM AND METHOD FOR IMPROVING TIME DOMAIN PROCESSED SENSOR SIGNALS

(75) Inventor: Jon C. Taenzer, Los Altos, CA (US)

(73) Assignee: Step Communications Corporation, San Jose, CA (US)

(*) Notice: Subject to any disclaimer, the term of this patent is extended or adjusted under 35 U.S.C. 154(b) by 0 days.

(21) Appl. No.: 11/212,923

(22) Filed: Aug. 26, 2005

(65) Prior Publication Data

US 2007/0046278 A1 Mar. 1, 2007

(51) Int. Cl.

| | |
|---|---|
| ***G01R 29/26*** | (2006.01) |
| ***G01R 27/28*** | (2006.01) |
| ***G01R 27/08*** | (2006.01) |
| ***H04B 15/00*** | (2006.01) |

(52) U.S. Cl. ...................... 324/613; 324/616; 324/709; 381/94.1; 381/94.8; 702/189

(58) Field of Classification Search ............. 324/76.52, 324/76.77, 613, 616, 709; 381/94.1, 94.8; 702/189

See application file for complete search history.

(56) References Cited

U.S. PATENT DOCUMENTS

| | | | | |
|---|---|---|---|---|
| 3,961,172 | A * | 6/1976 | Hutcheon | 708/813 |
| 4,599,622 | A | 7/1986 | Haupt | |
| 4,932,063 | A * | 6/1990 | Nakamura | 381/94.7 |
| 4,956,867 | A | 9/1990 | Zurek et al. | |
| 5,226,087 | A | 7/1993 | Ono et al. | |
| 5,289,544 | A | 2/1994 | Franklin | 381/68.1 |
| 5,383,457 | A | 1/1995 | Cohen | |
| 5,471,527 | A * | 11/1995 | Ho et al. | 379/347 |
| 5,581,495 | A | 12/1996 | Adkins et al. | |
| 5,581,620 | A | 12/1996 | Brandstein et al. | |
| 5,586,191 | A | 12/1996 | Elko et al. | |
| 5,884,254 | A | 3/1999 | Ucar | 704/231 |
| 5,896,449 | A * | 4/1999 | Oshidari et al. | 379/347 |
| 6,120,450 | A | 9/2000 | Li | |
| 6,668,062 | B1 | 12/2003 | Luo et al. | 381/122 |
| 6,867,731 | B2 | 3/2005 | Dizaji et al. | |
| 6,950,528 | B2 | 9/2005 | Fischer | |
| 7,099,698 | B2 | 8/2006 | Tarokh et al. | |

(Continued)

FOREIGN PATENT DOCUMENTS

WO WO 01/91513 A2 11/2001

OTHER PUBLICATIONS

Aarabi, Parham et al., "Phase-Based Dual Microphone Robust Speech Enhancement," IEEE 2004, pp. 1763-1773.

Marro, C. et al., "Analysis of Noise Reduction and Dereverberation Techniques Based on Microphone Arrays with Postfiltering," IEEE Trans. On Speech and Audio Processing, vol. 6, No. 3, May 1998, pp. 240-259.

Sachar, J. M. et al., "Microphone Position and Gain Calibration for a Large-Aperture Microphone Array," IEEE Trans. On Speech and Audio Processing, vol. 13, No. 1, Jan. 2005, pp. 42-52.

(Continued)

*Primary Examiner*—Vincent Q. Nguyen
*Assistant Examiner*—Amy He
(74) *Attorney, Agent, or Firm*—Thelen Reid Brown Raysman & Steiner LLP

(57) ABSTRACT

Noise discrimination in signals from a plurality of sensors is conducted by enhancing the phase difference in the signals such that off-axis pick-up is suppressed while on-axis pick-up is enhanced. Alternatively, attenuation/expansion are applied to the signals in a phase difference dependent manner, consistent with suppression of off-axis pick-up and on-axis enhancement. Nulls between sensitivity lobes are widened, effectively narrowing the sensitivity lobes and improving directionality and noise discrimination.

7 Claims, 16 Drawing Sheets

U.S. PATENT DOCUMENTS

| | | | | |
|---|---|---|---|---|
| 7,110,549 | B2 * | 9/2006 | Wildhagen | 381/13 |
| 7,171,008 | B2 | 1/2007 | Elko | |
| 2003/0147538 | A1 * | 8/2003 | Elko | 381/92 |
| 2003/0210179 | A1 | 11/2003 | Dizaji et al. | |
| 2004/0120532 | A1 | 6/2004 | Dedieu et al. | |
| 2005/0052556 | A1 | 3/2005 | Henderson et al. | |
| 2005/0157884 | A1 | 7/2005 | Eguchi | |
| 2005/0168808 | A1 | 8/2005 | Ishiwata | |
| 2005/0276504 | A1 | 12/2005 | Chui et al. | |
| 2006/0282262 | A1 | 12/2006 | Vos et al. | |
| 2007/0046540 | A1 | 3/2007 | Taenzer | |
| 2007/0047742 | A1 | 3/2007 | Taenzer et al. | |
| 2007/0047743 | A1 | 3/2007 | Taenzer et al. | |
| 2007/0047752 | A1 | 3/2007 | Wagner et al. | |
| 2007/0050161 | A1 | 3/2007 | Taenzer et al. | |
| 2007/0050176 | A1 | 3/2007 | Taenzer et al. | |
| 2007/0050441 | A1 | 3/2007 | Taenzer et al. | |
| 2007/0115078 | A1 | 5/2007 | Sano et al. | |

OTHER PUBLICATIONS

International Search Report and Written Opinion, International Application No. PCT/US06/33059, dated Mar. 5, 2007.

International Search Report and Written Opinion, International Application No. PCT/US06/33390, dated Feb. 12, 2007.

International Search Report and Written Opinion, Application No. PCT/US06/33220, dated Nov. 1, 2007.

International Search Report and Written Opinion, Application No. PCT/US06/33410 dated Oct. 1, 2007.

International Search Report and Written Opinion, Application No. PCT/US06/33600, dated Aug. 16, 2007.

* cited by examiner (a)

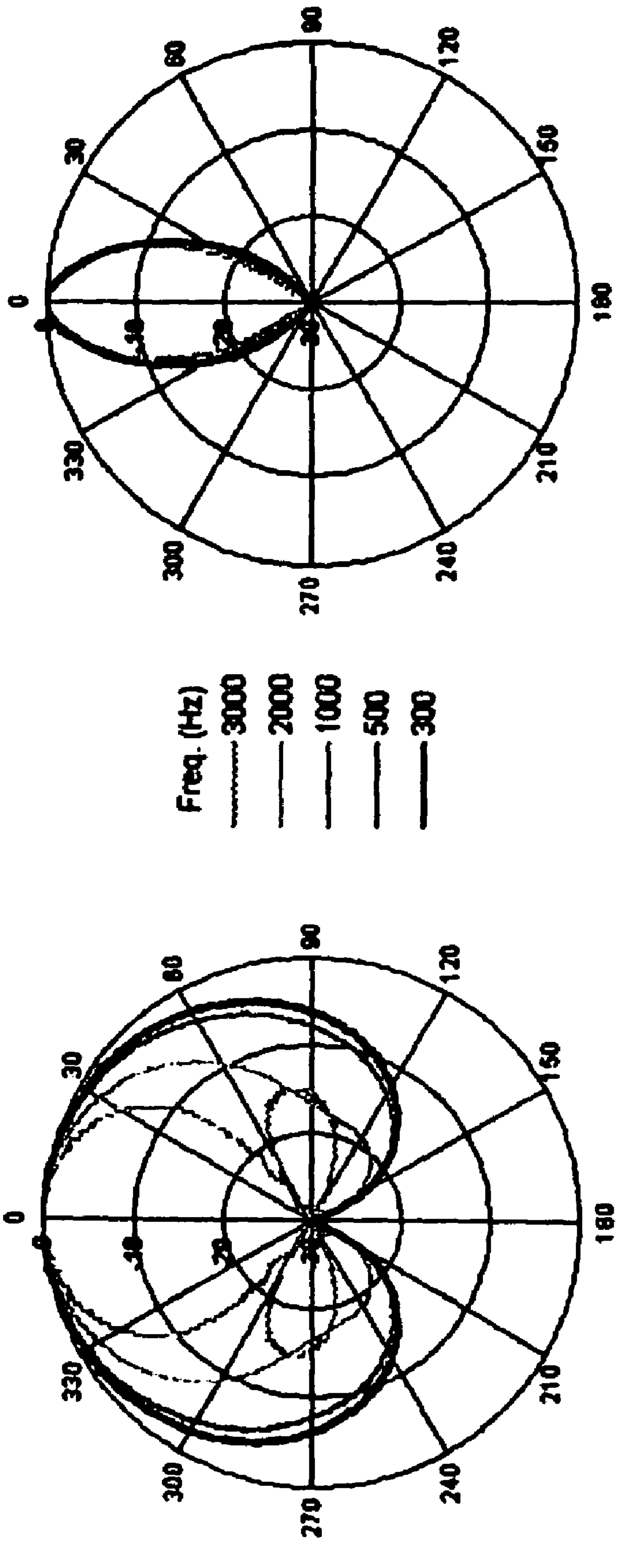
FIG 8 (a) (PRIOR ART) (b)

(c)

(PRIOR ART)

PRIOR ART (a)

SYSTEM AND METHOD FOR IMPROVING TIME DOMAIN PROCESSED SENSOR SIGNALS

FIELD OF THE INVENTION

The invention relates to noise discrimination in signal detection and processing.

DESCRIPTION OF THE RELATED ART

FIG. 1 is a block diagram of a conventional real-time frequency domain signal processing system 10 employing what is sometimes referred to as the frequency sub-band method or the frame-overlap-and-add method. This method uses a circuit 11 to divide incoming sampled temporal signal information into blocks of data referred to as frames. The sampled data can be provided directly from a digital sensor or other processing system, or can be provided from an analog sensor or processing system via a standard Analog-to-Digital conversion (A/D or ADC) method (not shown). The frames can be adjacent or overlapping. Since the data are samples of time domain data, all samples within a frame have no imaginary component, and the data is strictly "real." If required by the application, these frames of data then may be multiplied in a multiplication circuit 12 by an analysis window 14*a* to reduce artifacts that can be introduced by subsequent transformation of the sampled time data into the frequency domain. Subsequently, the windowed frames are transformed to the frequency domain by any one of the many such transformations known to those of ordinary skill in the art, such as for example the Hartley transform, the Wavelet transform, or the like. The most commonly used of these transformations is the Fourier transform. Since the data is sampled and digitized, the DFT, or Discrete Fourier Transform, is used in these cases, with a preference for using one of the fast-to-compute versions of this transform, known as the Fast Fourier Transform or FFT, represented at circuit 16.

Although there are choices for the analysis window, such as the Hanning window, that will reconstruct the time domain signal accurately without the added complexity and computational cost of a synthesis window, such analysis windows suffer from accuracy compromises to achieve the improved efficiency. Generally, a separate synthesis window 14*b* is applied by multiplication before the signal is reconstructed by the overlap and add circuit, 19 (as shown in FIG. 1) to overcome these compromises, but at added cost.

Once in the frequency domain, the data is represented by complex numbers containing both a "real" and an "imaginary" component. These complex numbers, one for each frequency "bin" of the transform, represent the magnitude and relative phase angle of the temporal input signal data averaged over the time interval contained within the length of the frame (and weighted by the windowing function) as well as over the range of frequencies contained within the bandwidth of the "bin." It is this input transform data that is then processed at circuit 17 by a selected process to create an output transform of processed frequency domain data.

Once the data is processed, the standard frequency domain method then calls for inverse transformation of each frame of processed data to create a string of processed time domain frames of "real" data. Circuit 18, denoting an inverse fast Fourier transform (IFFT) process, performs this objective. If a synthesis window 14*b* is used, then it is applied at circuit 13 by multiplication of the output frame of time domain data with the selected synthesis window: otherwise the output frame of data from circuit 18 is passed directly to circuit 19. Alternatively, the frequency domain representation of the synthesis window can be applied to the output from the signal process 17 by convolving the output from the process with the transformed synthesis window before performing the inverse Fourier transform at circuit 18. The time domain frames are subsequently re-assembled by circuit 19 by performing concatenating or overlapping-and-adding of the frames of processed real-time data to create the final digitized and sampled temporal output signal waveform containing the processed signal information. Of course, this sampled signal can be, and often is, converted into an analog signal by the use of a standard Digital-to-Analog conversion (D/A or DAC) method (not shown) so that the processed output signal can be used in myriad applications, such as scientific measurement, telephony, entertainment systems, communication systems, and so on.

Alternatively, the process can be applied in the time domain, wherein, for example, the input signal, either analog or digitized, is passed through a bank of bandpass frequency discrimination filters (either analog or digital as appropriate). The outputs of each of the frequency filters is subsequently processed, and the processed signals are then combined to form a processed output signal by adding the processed signals together.

FIG. 2(*a*) shows the elements of a conventional prior art beamforming system, where a sensor system 21 provides two or more input signals 22 that are time-aligned for the signal of interest. For best performance, these sensor signals should have matched sensitivity for all signals. The input sensor signals 22 provide the input data for the vector summing beamforming process of the system, as shown at circuit 23.

Although the vector summing process 23 is often performed as a vector average, a vector average is simply a vector sum divided by a scalar number, and will simply be referred to hereinafter as a vector sum.

Consider one of the simplest beamforming sensor systems, the two-element broadside array 30 shown in FIG. 3. The two sensor elements 32 and 34 of this array are located on the axis X. It is well known that such a beamforming system can be steered using conventional signal delay methods. In particular, conventional beam steering is accomplished by varying relative phases of the input signals in such a way that the incoming signal pattern is reinforced in a desired direction and suppressed in undesired directions. The phase change is equivalent to a time delay—that is, the phase change at each frequency is a fixed offset, and the phase change over frequency is linear. However, for simplicity here it is assumed that the signal source of interest lies on the sensitivity axis I of the array—that is, that the two sensor signals are appropriately time delayed so as to be time-aligned for the desired signal of interest. When the sensor elements 32 and 34 are omni-directional and spaced one-half wavelength apart (180 electrical degrees), the two-element broadside beamforming system, as shown in FIG. 2(*a*), outputs a signal that is directly proportional to the vector sum of the two sensor element signals. This output has a sensitivity beam pattern resembling a figure-eight—that is, one having two sensitivity lobes 35 and 36 as shown in FIG. 3. These lobes are maximum in the on-axis direction, but are zero at ±90° azimuth directions (in the directions of axis X). These are the directions at which the electrical phase difference between the sensor's signals is ±180° and therefore where the signals cancel when summed together. The resulting low sensitivity regions 37 and 38 are referred to as "nulls."

To improve the directionality of a sensor system normally implies narrowing the width of the main lobe(s) of sensitivity, which in FIG. 3 is either lobe 35 or 36 (or both). In a conventional beamforming system, narrowing of the main sensitivity lobe is accomplished by incorporating additional sensor elements to enlarge the array, thereby increasing the acceptance aperture that concomitantly reduces the beam width. However, there are costs to this approach, including the additional sensor elements and associated amplifiers and A/D converters (in a digital system) or filters (in an analog system), the added computational costs for processing all the sensor signals, the result that the beam pattern becomes complex with many added side lobes in which the sensitivity of the system to unwanted signal sources is relatively high (that is, the system has relatively low noise immunity), the large physical size of the sensor array, and non-uniform frequency response for off-axis signals, among others.

For these reasons, another method called "super resolution" beamforming has been employed, wherein the increased aperture is filled with additional sensor elements, but the elements are non-uniformly spaced and the resulting sensor signals are non-uniformly weighted in amplitude. In such a system (not shown), the width of the main lobe of sensitivity can be more greatly narrowed as compared to a similar beamforming system with uniformly spaced sensor elements. However, to be successful the super resolution approach still requires a great number of sensor elements and associated circuitry and suffers from significantly increased computational costs, high side lobe sensitivity, large physical size, and non-uniform off-axis frequency response.

In order to address the side lobe pickup problem, another method has been employed in which additional beamformer systems are used with the same set of array sensor signals. The additional beamformers create sensitivity beams that are in the directions of the side lobes of the main beamformer. The output signals from these additional beamformers are then scaled and subtracted from the output signal from the main beamformer in order to partially cancel the main beamformer's side lobes. In general, although the side lobes can be reduced with such an approach, the tradeoffs include a wider main lobe, high complexity and cost, and the retention of a high number of sensors.

Yet another category of conventional beamformer is the generalized side lobe canceller (GSC) where a multiple sensor system is combined with a null-steering method. In this technology, the sensitivity toward the desired source is maintained constant while one or more of the nulls are steered toward detected off-axis noise sources. Examples of this type of beamforming system are the well known Griffiths-Jim beamformer and the Frost beamformer. In this type of beamforming system the number of discrete noise sources that can be nulled is equal to the number of independently steerable nulls, and the number of independently steerable nulls is equal to one less than the number of sensors. Thus, to be effective in most real-life situations where there are numerous noise sources and multiple-reflections of those noise sources, the number of sensors must be large, along with the associated high system complexity, large compute power requirement, and high cost. Further, such systems, because the nulls are very narrow, require adaptive circuit techniques to accurately center the nulls on the noise source directions, and these adaptive methods are slow to adapt, allowing significant noise to pass during the adaptation time.

One common characteristic of these prior art systems is that the null or nulls created by these methods are quite narrow. As more sensor elements are incorporated, more nulls are created and the numerous resulting nulls are narrower yet.

BRIEF SUMMARY OF THE INVENTION

In accordance with one aspect of the invention, there is provided a method for improving noise discrimination in a system having a plurality of sensors each generating a sensor input signal representable by an input vector having phase and magnitude components in response to a signal stimulus, the plurality of sensors being arranged to have an on-axis direction. This method includes generating from at least two input vectors an input phase difference value, enhancing the input phase difference value as a function of the location of the signal stimulus relative to the on-axis direction, generating two output vectors corresponding to the two input vectors, the two output vectors having a phase difference based on the enhanced input phase difference value, and combining the two output vectors.

In accordance with a further aspect of the invention, there is provided a method for improving noise discrimination in a system having a plurality of sensors each generating a sensor input signal representable by an input vector having phase and magnitude components in response to a signal stimulus, the plurality of sensors being arranged to have an on-axis direction. This method includes generating an attenuation factor as a function of a phase difference from two input vectors, combining the two input vectors to obtain an output vector, and attenuating the output vector by the attenuation factor.

In accordance with a further aspect of the invention, there is provided a method for improving noise discrimination in a system having a plurality of sensors each generating an input signal representable by an input vector having a phase component and a magnitude component, the plurality of sensors arranged to have an on-axis direction. The method includes using a first pair of sensors to obtain a coarse vector phase difference corresponding to a coarse measurement of an angle of arrival of a signal input source relative to the on-axis direction, using a second pair of sensors to obtain a fine vector phase difference corresponding to a fine measurement of the angle of arrival of the signal input source, generating an input phase difference value from the coarse and fine vector phase differences, enhancing the input phase difference value as a function of the angle of arrival to generate an output phase difference value, generating first and second output vectors having a phase difference based on the output phase difference value, and combining the first and second output vectors.

In accordance with a further aspect of the invention, there is provided a method for improving noise discrimination in a system having a plurality of sensors each generating an input signal representable by an input vector having a phase component and a magnitude component, the plurality of sensors arranged to have an on-axis direction. This method includes using a first pair of sensors to obtain a coarse vector phase difference corresponding to a coarse measurement of an angle of arrival of a signal input source relative to the on-axis direction, using a second pair of sensors to obtain a fine vector phase difference corresponding to a fine measurement of the angle of arrival of the signal input source, generating an attenuation factor as a function of the coarse and fine vector phase differences, combining the input vectors corresponding the second pair of sensors to obtain an output vector, and attenuating the output vector by the attenuation factor.

In accordance with a further aspect of the invention, there is provided a method for enhancing regional sensitivity noise discrimination from first and second pairs of sensors, each sensor generating a sensor input signal representable by an input vector having a magnitude and phase. This method includes applying a first process to the first pair of sensors to obtain a first output corresponding to sensitivity in a first region, applying a second process to the second pair of sensors to obtain a second output corresponding to sensitivity in a second region, and combining the first and second outputs. The first process includes enhancing an input phase difference value corresponding to a phase difference between signals from first and second sensors in the first pair of sensors.

In accordance with a further aspect of the invention, there is provided a method for enhancing regional sensitivity noise discrimination from first and second pairs of sensors, each sensor generating a sensor input signal representable by an input vector having a magnitude and phase. The method includes applying a first process to the first pair of sensors to obtain a first output corresponding to sensitivity in a first region, applying a second process to the second pair of sensors to obtain a second output corresponding to sensitivity in a second region, and combining the first and second outputs. The first process includes attenuating an output vector obtained by combining first and second input vectors corresponding to signals from first and second sensors of the first pair of sensors by an attenuation factor which is a function of a difference in phase between the first and second input vectors.

In accordance with a further aspect of the invention, there is provided a method for accommodating device and/or signal mismatch in a sensor array system including first and second sensors generating first and second input signals representable at at least one frequency by first and second input vectors each having a phase component and a magnitude component. The method includes, at the at least one frequency, using the magnitude of the first and second input vectors to obtain corresponding first and second mathematically mean matched vectors.

In accordance with a further aspect of the invention, there is provided a beamformer using a plurality of sensors each producing a sensor input signal representable by an input vector having phase and magnitude components. The beamformer includes a combining circuit for receiving the sensor input signals and generating a combined signal therefrom, a first differencing circuit for receiving the sensor input signals and generating a first difference signal therefrom, an adaptive filter for receiving the difference signal and generating a filtered signal therefrom, a second differencing circuit for receiving the filtered signal and a delayed version of the combined signal and generating an output signal therefrom, and a phase difference enhancement circuit for enhancing a phase difference of input vectors representing sensor input signals from the plurality of sensors.

In accordance with a further aspect of the invention, there is provided a beamformer using a plurality of sensors each producing a sensor input signal representable by an input vector having phase and magnitude components, the beamformer including a combining circuit for receiving the sensor input signals and generating a combined signal therefrom a first differencing circuit for receiving the sensor input signals and generating a first difference signal therefrom an adaptive filter for receiving the difference signal and generating a filtered signal therefrom, a second differencing circuit for receiving the filtered signal and a delayed version of the combined signal and generating an output signal therefrom, and a phase difference responsive circuit for receiving at least one of the signals, and modifying that signal to produce a modified signal that is a function of the phase difference of the input signals from the plurality of sensors.

In accordance with a further aspect of the invention, there is provided a beamformer using a plurality of sensors each producing a sensor input signal representable by an input vector having phase and magnitude components. The beamformer includes a processing circuit for receiving the sensor input signals and generating a processed signal therefrom, the processing circuit including a first phase difference enhancement circuit for enhancing the phase difference of input vectors representing sensor input signals from the plurality of sensors, a first differencing circuit for receiving the sensor input signals and generating a first difference signal therefrom, an adaptive filter for receiving the difference signal and generating a filtered signal therefrom, a second differencing circuit for receiving the filtered signal and a delayed version of the processed signal and generating an output signal therefrom, and a second phase difference enhancement circuit for enhancing a phase difference of input vectors representing sensor input signals from the plurality of sensors.

In accordance with a further aspect of the invention, there is provided a method for time domain processing of signals from a plurality of sensors. The method includes obtaining from the plurality of sensors a plurality of corresponding input signals, applying the input signals to a bank of bandpass frequency discrimination filters to thereby obtain filtered signals from each filter, generating phase angle difference values from the filtered signals, attenuating each of the plurality of input signals by an attenuation factor which is a function of the phase angle difference values, and combining the plurality of attenuated input signals.

In accordance with a further aspect of the invention, there is provided a method for time domain processing of signals from a plurality of sensors, the method including obtaining from the plurality of sensors a plurality of corresponding input signals each representable by an input vector having phase and magnitude components, applying the input signals to a bank of bandpass frequency discrimination filters to thereby obtain a filtered signal corresponding to each sensor from each filter, generating, for each filter, an instantaneous phase angle difference value representative of the phase angle difference between the filtered signals from that filter, enhancing the phase component of each filtered signal by an enhancement value which is a function of the instantaneous phase angle difference value associated with that filter to thereby obtain enhanced output signals, and combining the enhanced output signals.

In accordance with a further aspect of the invention, there is provided a pickup device that includes at least first and second sensors generating first and second sensor input signals, respectively, in response to a signal stimulus, the first and second input signals being representable by first and second input vectors each having a phase component and a magnitude component. The pickup device also includes at least one circuit adapted to: generate from the first and second senor input vectors an input phase difference value; enhance the input phase difference value as a function of the location of the signal stimulus relative to an on-axis direction of the at least first and second sensors; generate two output vectors corresponding the first and second input vectors, the two output vectors having a phase difference based on the enhanced input phase difference value; and combine the two output vectors.

In accordance with a further aspect of the invention, there is provided a system for improving noise discrimination in at least first and second input signals representable by first and second input vectors each having a phase component and a magnitude component. The system includes a first circuit adapted to generate an attenuation factor as a function of a phase difference of the first and second input vectors, a combiner for combining the first and second input vectors into an output vector, and an attenuation circuit for attenuating the output vector by the attenuation factor.

In accordance with a further aspect of the invention, there is provided a device for improving noise discrimination. The device includes first and second pairs of sensors arranged to have an on-axis direction, each sensor generating an input signal representable by an input vector having a phase component and a magnitude component. The device further includes at least one circuit adapted to: generate from the first pair of sensors a coarse vector phase difference corresponding to a coarse measurement of an angle of arrival of a signal input source relative to the on-axis direction; generate from the second pair of sensors a fine vector phase difference corresponding to a fine measurement of the angle of arrival of the signal input source; generate an input phase difference value from the coarse and fine vector phase differences;

enhance the input phase difference value as a function of the angle of arrival to generate an output phase difference value; generate first and second output vectors having a phase difference based on the output phase difference value; and combine the first and second output vectors.

In accordance with a further aspect of the invention, there is provided a device from improving noise discrimination, the device including first and second pairs of sensors arranged to have an on-axis direction, each sensor generating an input signal representable by an input vector having a phase component and a magnitude component. The device also includes at least one circuit adapted to: generate from the first pair of sensors a coarse vector phase difference corresponding to a coarse measurement of an angle of arrival of a signal input source relative to the on-axis direction; generate from the second pair of sensors a fine vector phase difference corresponding to a fine measurement of the angle of arrival of the signal input source; generate an attenuation factor as a function the coarse and fine vector phase differences; combine the input vectors corresponding to the second pair of sensors to obtain an output vector; and attenuate the output vector by the attenuation factor.

In accordance with a further aspect of the invention, there is provided a system exhibiting enhanced regional sensitivity noise discrimination. The system includes first and second pairs of sensors, each sensor generating a sensor input signal representable by an input vector having a magnitude and phase, a at least one circuit adapted to: apply a first process to the first pair of sensors to obtain a first output corresponding to sensitivity in a first region; apply a second process to the second pair of sensors to obtain a second output corresponding to sensitivity in a second region; and combine the first and second outputs. The first process includes enhancing an input phase difference value corresponding to a phase difference between signals from first and second sensors in the first pair of sensors.

In accordance with a further aspect of the invention, there is provided a system exhibiting enhanced regional sensitivity noise discrimination. The system includes first and second pairs of sensors, each sensor generating a sensor input signal representable by an input vector having a magnitude and phase, and at least one circuit adapted to: apply a first process to the first pair of sensors to obtain a first output corresponding to sensitivity in a first region; apply a second process to the second pair of sensors to obtain a second output corresponding to sensitivity in a second region; and combine the first and second outputs. The first process includes attenuating an output vector obtained by combining first and second input vectors corresponding to signals from first and second sensors of the first pair of sensors by an attenuation factor which is a function of a difference in phase between the first and second input vectors.

In accordance with a further aspect of the invention, there is provided a sensitivity matching circuit adapted to accommodate device and/or signal mismatch in a sensor array system that includes first and second sensors generating first and second input signals representable at at least one frequency by first and second input vectors each having a phase component and a magnitude component. The sensitivity matching circuit includes one or more circuits adapted to use the magnitude of the first and second input vectors to obtain corresponding first and second mathematically mean matched vectors.

BRIEF DESCRIPTION OF THE SEVERAL VIEWS OF THE DRAWINGS

Many advantages of the present invention will be apparent to those skilled in the art with a reading of this specification in conjunction with the attached drawings, wherein like reference numerals are applied to like elements, and wherein.

DETAILED DESCRIPTION OF THE INVENTION

In accordance with an aspect of the invention, a novel approach based on enhancing the performance of beamforming systems is disclosed. As a general aim, an aspect of the invention operates on the principle of enhancing or enlarging the nulls of a beam pattern created by such a beamforming system.

Figure 3:
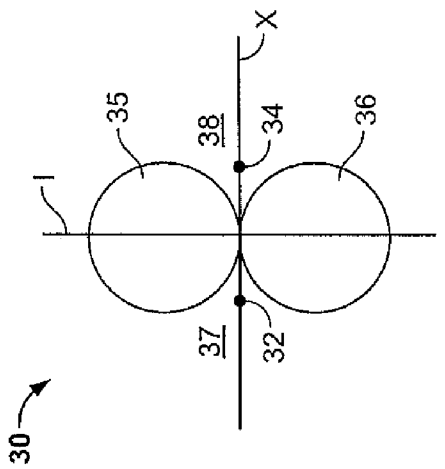
FIG. 3 is a schematic diagram of a conventional beamforming sensor system consisting of a two-element broadside array.

The novel approach, in accordance with an aspect of the invention, is to widen the nulls—that is, regions 37 and 38 in FIG. 3—rather than to narrow the main lobes 35 and 36 of a beamforming system. This approach improves directionality, but by way of a unique and advantageous apparatus and method. By widening the nulls using the inventive method, the improved directionality is accomplished without increasing the number of sensor elements and associated amplifiers and A/D converters (in a digital system) or filters (in an analog system), with reduced computational costs for processing the sensor signals, with the result that the beam pattern is simple without added side lobes and their increased sensitivity to unwanted noise signal sources, with small physical size of the sensor array, with low system hardware costs, without long adaptation times, and with the added ability to produce uniform frequency response for off-axis signals, among other benefits. It will be appreciated that while for simplicity, the following descriptions will discuss a two-sensor implementation of the invention, the same techniques are extendable to arrays having a greater number than two, in one-, two-, and three-dimensional arrangements.

Figure 2:
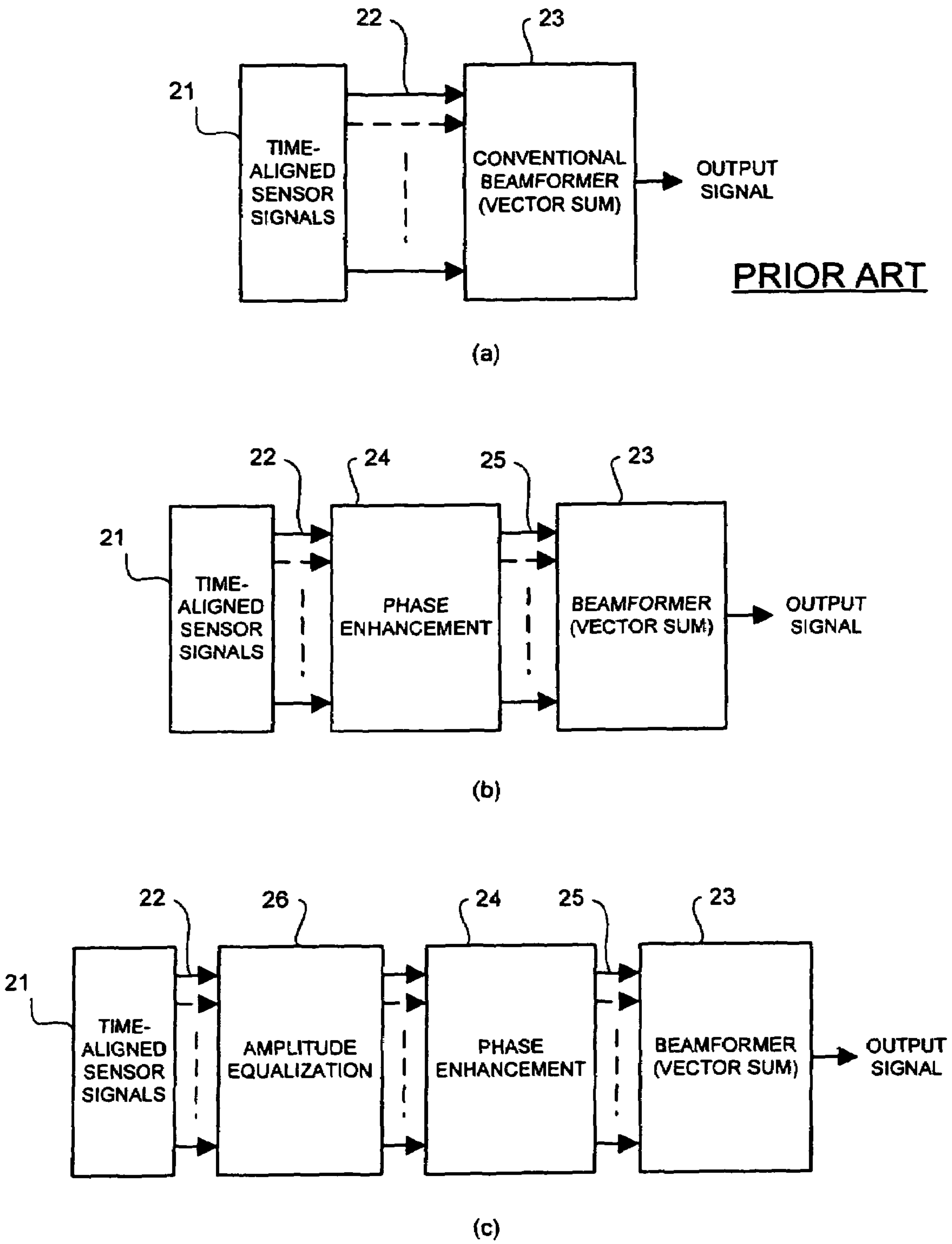
FIG. 2A is a block diagram showing the elements of a conventional beamforming system in which a sensor system 21 provides two or more input signals 22 that are time-aligned for the signal of interest.
FIG. 2B is a block diagram showing the elements of an inventive system in which a phase enhancement process 24 is disposed between the acquisition of the sensor signals and the beamforming process.
FIG. 2C is a block diagram showing the inventive use of a signal sensitivity matching circuit located in advance of a phase enhancement circuit depicted in FIG. 2.

As shown in FIG. 2(*b*), in one aspect of the invention, a phase enhancement process 24 is disposed between the acquisition of the sensor signals 21 and the beamforming process 23. The phase enhancement process 24 produces phase-enhanced signals 25 that are then used as input signals by the beamforming process 23.

Figure 4:
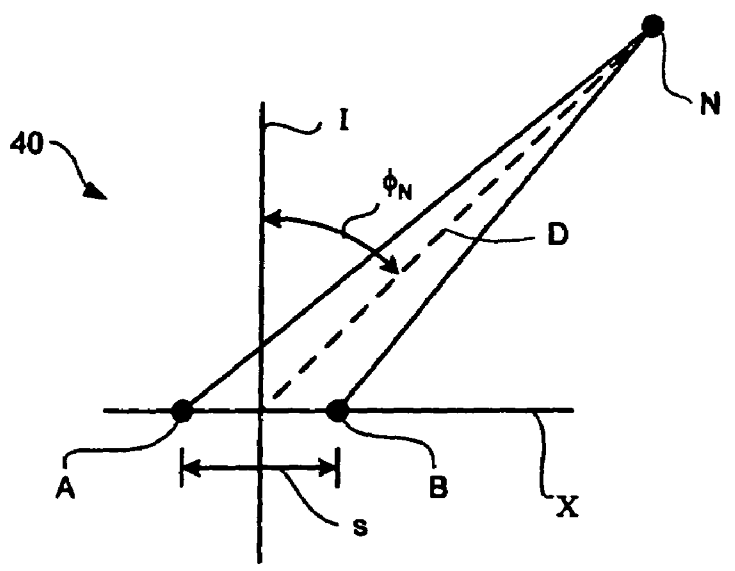
FIG. 4 is a depiction of a principle behind one aspect of the invention, in which two sensor elements A and B are shown arranged along a line X in a broadside array configuration 40, and an off-axis noise source, N, is shown at the physical azimuthal arrival angle $\phi_N$ away from the axis I of maximum sensitivity.

A principle behind one aspect of the invention is illustrated in FIG. 4, showing two sensor elements A and B arranged along a line X in a broadside array configuration 40, and an off-axis noise source, N, located at the physical azimuthal arrival angle $\phi_N$ away from the axis I of maximum sensitivity. Because there are two input signals for this system, one from each of sensor elements A and B, two Fourier input signal transforms are available to the process. Each transform consists of many frequency "bins" of data, and each data value in a bin is a complex number Z, wherein $$Z=M\cos\theta+iM\sin\theta$$

containing information about both the magnitude (M) and the relative signal phase (θ) of each signal during a particular interval of time—that is, a particular frame.

Within a frame, for example for input signal A, the value in the $n^{th}$ bin of its input Fourier transform is:

$$Z_A(n)=M_A(n)\cos\theta_A(n)+iM_A(n)\sin\theta_A(n)$$

where $M_A(n)$ is the average magnitude of input signal A for the frequencies represented by frequency bin n, and where $\theta_A(n)$ is the average relative signal phase of input signal A for the frequencies represented by the same frequency bin n. The signal phase is often referred to as the "electrical phase" of the signal.

Similarly, for input signal B, the value in the $n^{th}$ bin of its input Fourier transform is:

$$Z_B(n)=M_B(n)\cos\theta_B(n)+iM_B(n)\sin\theta_B(n)$$

where $M_B(n)$ is the average magnitude of input signal B for the frequencies represented by frequency bin n, and where $\theta_B(n)$ is the average relative signal phase of input signal B for the frequencies represented by frequency bin n. Thus, for each frequency corresponding to a bin there are available to the process two complex numbers allowing the calculation of two relative input signal phase angle values, namely $\theta_A(n)$ and $\theta_B(n)$.

Henceforth, for simplicity it will be assumed that each calculation is performed on a bin-by-bin basis and the frequency bin index n will be dropped.

Figure 5:
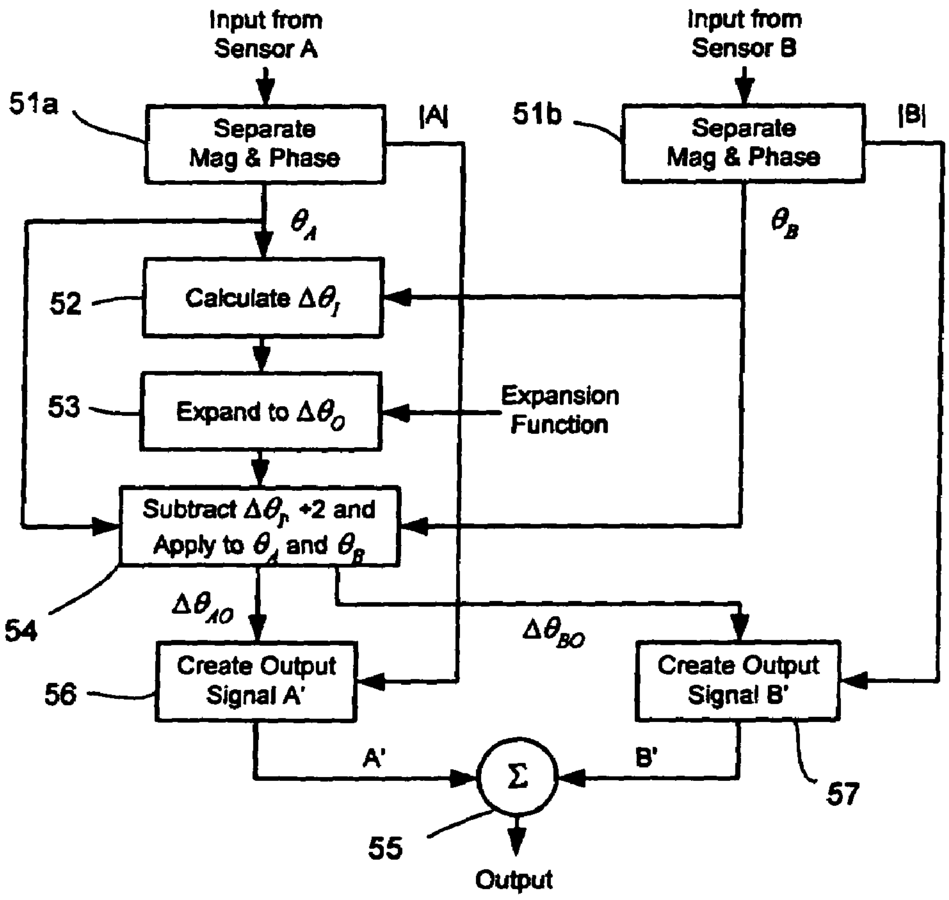
FIG. 5 is a flow diagram illustrating an implementation of one aspect of the invention.

FIG. 5 is a flow diagram illustrating an implementation of one aspect of the invention. At 51*a* and 51*b*, magnitude and phase information of the signals from sensors A and B is obtained. For each bin pair, the difference between the two relative input signal electrical phase angle values is calculated at 52. In other words:

$$\Delta\theta_I=\theta_A-\theta_B \text{ or, alternatively } \Delta\theta_I=\theta_B-\theta_A$$

where $\theta_A$ or $\theta_B$ is the arctangent of the ratio of the imaginary part of the input signal divided by the real part of part of the input signal, and $\Delta\theta_I$ is the signal electrical phase angle difference between the two input signals A and B for each frequency bin pair.

Although the mathematical method shown above is theoretically correct, in practical (real-world) systems, the arctangent function usually generates a relative phase value that is restricted to the interval $-\pi \leqq \Delta\theta < \pi$. Thus, when calculating the input signal phase difference angle value $\Delta\theta_I$, the calculated result is on the interval $-2\pi \leqq \Delta\theta < 2\pi$. Although this value can be used directly to accomplish the inventive process, for mathematical reasons it is often more convenient if the value lies on the interval $-\pi \leqq \Delta\theta < \pi$. The calculated input signal phase difference angle value $\Delta\theta_I$ can be "re-wrapped" to lie on the desired interval by the process of adding $2\pi$ when the value is less than $-\pi$, and subtracting $2\pi$ when the value is more than $\pi$. No change is made when the value already lies on the interval $-\pi \leqq \theta < \pi$. After this calculation, the resulting value for $\Delta\theta_I$ lies on the desired interval $-\pi \leqq \theta < \pi$.

After re-wrapping the resulting phase difference value, an input electrical phase difference number representing the input signal phase difference value between the two sensor signals is generated. In theory, since the signal of interest lies on the sensing axis I of the array system 40, in other words since the portion of signals A and B representing the desired signal are time-aligned, there will be no phase difference for that signal and the phase difference number should be zero. However, for signals arriving from unwanted off-axis "noise" sources, N, there will be an electrical phase difference, and the phase difference number is a function of the azimuthal angle of arrival, $\phi_N$.

With reference to FIG. 4, it will be appreciated that the following applies:

$$\Delta\theta_I = \pi \cdot f\left\{\sqrt{s^2 + 4(D^2 + Ds\cdot\sin\phi_N)} - \sqrt{s^2 + 4(D^2 - Ds\cdot\sin\phi_N)}\right\}/2c$$

where f is the center frequency for the frequency bin, s is the physical spacing between the sensor elements, D is the distance from the center of the sensor array to the noise source N, c is the propagation speed of the signal (here it is the speed of sound in air), and $\phi_N$ is the azimuthal angle of arrival of the signal from noise source N.

If D>>s, in other words if the noise source N is located a significant distance from the array, then the electrical phase difference number simplifies to:

$$\Delta\theta_I = \pi\frac{f\cdot s}{c}\cdot\sin\phi_N$$

By making the system of the invention "think" that the arrival of most off-axis noise signals is from sources that are near ±90° azimuth, these signals are made to fall in the nulls, and are then considerably attenuated by the subsequent beamforming process of signal vector summation. In accordance with one aspect of the invention, this is accomplished by expanding the measured input electrical phase difference number $\Delta\theta_I$ toward ±180° at 53 in FIG. 5 using an appropriate expansion function.

It will be appreciated that vector summation includes both summation with and without first inverting the signals provided to the summation circuit. In general, broadside array beamforming does not utilize signal inversion, while end-fire array beamforming does. Both types of beamforming systems are contemplated to be within the scope of this invention.

Additionally, for the purposes of this invention, phase enhancement includes both phase expansion using an expansion function, as discussed above, and phase compression, as will be described below. Phase expansion applies in many array systems, such as the broadside beamformer, for narrowing the main sensitivity lobe. Alternatively, in signal differencing array systems, such as are many end-fire array systems, phase compression is required to narrow the main sensitivity lobe. However, there are applications wherein instead the nulls are to be narrowed, and in such systems phase expansion and phase compression are also contemplated. This is discussed, for example, below in reference to the GSC beamforming system.

Now considering the case where summation is performed without inversion, many functions may be used for expanding the input electrical phase difference number. In one embodiment of this invention, wherein the desired source of acoustic signals is time-aligned such that the electrical signals produced by the sensor elements are in phase, all of the available expansion functions will have one property in common: they will not change a phase difference that is at 0°, since signals with such a difference is most likely from the desired source and should not be attenuated. However, as the electrical phase difference between the input signals increases (either plus or minus) away from 0°, there is increasing likelihood that the signal pair originates from undesired off-axis noise sources. Thus, for example, an electrical phase difference of 45° can be expanded to for example 80° before the two signals are combined in the beamforming process. Such an expansion will decrease the magnitude of the output signal, since the two signals are summed in the beamforming process, and the two signals will be more out of phase after the expansion. As the input phase angle difference increases, the expanded output difference is moved more and more toward ±180°. Thus, for example, an electrical phase difference of 90° can be expanded to 179° before the two signals are combined in the beamforming process, giving a nearly complete attenuation for such signals.

Expanding the input electrical phase angle difference number $\Delta\theta_I$ to create the expanded output signal phase angle difference number $\Delta\theta_O$ is accomplished by applying an appropriate expansion function having the characteristics just described. One such function is:

$$\Delta\theta_O = \pi\cdot sgn(\Delta\theta_I)\cdot\left\{1 - \left[1 - \left(\frac{|\Delta\theta_I|}{\pi}\right)\right]^S\right\} \quad (1)$$

where the angles $\Delta\theta_I$ and $\Delta\theta_O$ are expressed in radians, and S is a parameter that controls the narrowness or sharpness of the resulting sensitivity beam, $1 < S \leqq \infty$.

Figure 6:
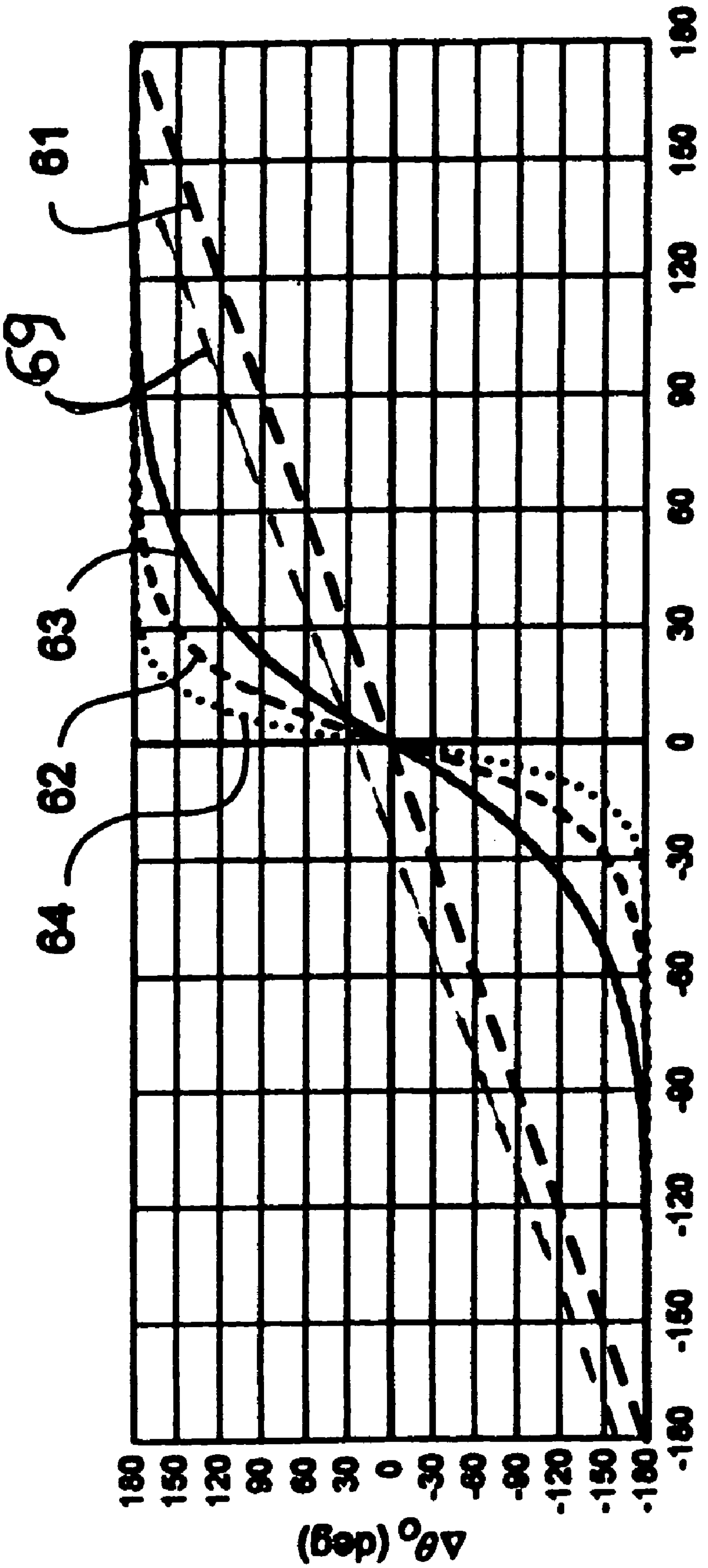
FIGS. 6A and 6B are graphs depicting the effect of applying some of the inventive formulae to enhance the angular phase difference between two input signal vectors.

FIG. 6(*a*) is a graph depicting the effect of applying this formula to enhance the angular phase difference between the two input signal vectors. The input electrical phase difference number $\Delta\theta_I$ is plotted on the ordinate, or horizontal axis, while the expanded electrical phase angle difference number $\Delta\theta_O$ is plotted on the abscissa, or vertical axis.

When there is no expansion, for example when the sharpness parameter S is set equal to 1 in the above equation, the output signal phase angle difference number $\Delta\theta_O$ is equal to the input signal phase angle difference number $\Delta\theta_I$—that is, $\Delta\theta_O = \Delta\theta_I$—and the system operates like a conventional beamforming system. This condition is shown by the diagonal graph curve 61 in FIG. 6 (*a*).

However, for larger values of S, the phase difference is expanded and a commensurate improvement of the sensitivity beam pattern is realized. The graph curve 62 shown in FIG. 6(*a*) illustrates the expansion curve that results from setting the sharpness parameter S equal to a value of 10 in Equation 1. Note that the curve passes through the point 0,0 so that no change is effected for signals arriving from the desired source location that is on the main sensitivity axis. For signals arriving from azimuth angles away from the main sensitivity axis, the input electrical phase angle difference number $\Delta\theta_I$ has a non-zero value and the resulting enhanced output electrical phase angle difference number $\Delta\theta_O$ is thereby changed away from the original input electrical phase angle difference value and toward ±180 electrical degrees when expansion is effected commensurate with curves 62-64.

Curves 63 and 64 show the phase expansion characteristics of Equation 1 for S values of 5 and 20 respectively. Thus, for this equation, as the sharpness value is increased, the phase enhancement increases. This provides a method for setting the resulting beam width in a particular application to exclude the pickup of off-axis noise signals as required for that application. However, it also provides a method of controlling the resulting beam characteristics as a function of any other parameter, for example to frequency-compensate the system's sensitivity to off-axis signals by varying the value of the parameter S as a function of frequency in order to create a constant width beam across all frequencies. Alternatively, the sharpness parameter S may be varied in real time to provide beam control in real time.

It is instructive to compare at this juncture the behavior of a conventional beam steering system. It will be recalled that in such a system, beam steering is accomplished by varying relative phases of the input signals in such a way that the incoming signal pattern is reinforced in a desired direction and suppressed in undesired directions. The phase change is equivalent to a time delay—that is, the phase change at each frequency is a fixed offset, and the phase change over frequency is linear. Since unlike in the presently claimed invention there is no phase enhancement in a conventional beam steering system (that is, "S" in such a system, if expressed in the language of the invention, would have a value of 1), the conventional beam steering system curve in FIG. 6*a* would assume a straight line, parallel to line 61, and not passing through the point 0,0. Such a line is designated at 69 in FIG. 6*a*.

FIG. 6(*b*) shows examples of additional enhancement functions and the resulting enhancement curve for each. As exemplified by the curves labeled 65 and 66, the phase need not be expanded at every value away from the point 0,0. For these curves, there is compression over a limited range near 0,0, but phase expansion occurs at input difference values further away. The curve labeled 67 demonstrates that expansion may also be limited to input electrical phase difference numbers near to the point 0,0, while no expansion or even compression may occur for input phase difference values near ±180 degrees.

This discussion has addressed only a few examples of the possible enhancement formulas and curves, and is not intended to be limiting. Formulae that include the point 0,0, and curves that pass through the point 0,0, and expand the phase difference—in other words increase the phase difference—at other points conform to one aspect of the invention. Formulas and curves that maintain a constant phase difference at some other selected point, and expand the phase difference at other points conform to another aspect of the invention. In accordance with another aspect of the invention, expansion is only applied to some input phase angle difference number values, $\Delta\theta_I$. In practice, phase expansion will likely be applied, to a greater or lesser extent, to most values, although it will be recognized that there is no requirement that expansion be applied to most or even a substantial portion of the values. Further, in some applications, the phase enhancement may be applied using a look-up table of discrete values, rather than by using a continuous function or curve, and while the term phase enhancement is used in a general sense, it will be recognized that compression, or reduction of the phase difference is included in the general concept of phase enhancement as referred to herein.

As seen from Equation 1 above, the sign of the input phase angle difference number $\Delta\theta_I$ is used separately from its magnitude. Since the magnitude never takes on negative values, the magnitude of the rewrapped input phase angle difference number can be expanded using a function that is valid over the interval $0 \leqq |\Delta\theta_I| \leqq \pi$, and then combined with the sign of the input phase angle difference $\Delta\theta_I$ to produce the output electrical phase angle difference number $\Delta\theta_O$. Alternatively, the unwrapped input phase angle difference value can be expanded using a repeating function over the interval $-2\pi \leqq \Delta\theta_I$ (unwrapped) $\leqq 2\pi$. An example of such a function is:

$$\Delta\theta_O = \pi \cdot \left( \frac{|\Delta\theta_I - \pi|}{\pi - \Delta\theta_I} \cdot \frac{|\Delta\theta_I + \pi|}{|\Delta\theta_I + \pi|} \right) \cdot \sin\left( \frac{\Delta\theta_I}{2} \right)$$

where $\Delta\theta_I$ and $\Delta\theta_O$ are the unwrapped signal phase difference values measured in radians.

Furthermore, the enhancement process can be implemented without a direct calculation of the input signal electrical phase angle difference number $\Delta\theta_I$ which requires the calculation of two arctangents. In many digital computation systems, a direct calculation of the arctangent function is relatively computationally intensive, and an enhancement method that does not require the arctangent calculation is desirable. This goal can be accomplished, for example, by using a value proportional to the tangent of the input signal phase angle difference number $\Delta\theta_I$ rather than $\Delta\theta_I$ itself. Such a value can easily be computed by using the unit vectors of the input signal vectors A and B. A unit vector is simply a vector that has a magnitude of 1, but the same angle as that of the original vector. The unit vector can be computed by dividing the complex number representing the input vector by its own scalar magnitude.

Let A" and B" be the unit vectors of A and B. The ratio of the magnitude of the difference of A" and B" to the magnitude of the sum of A" and B" is equal to the tangent of $\Delta\theta_I/2$. This result can be used directly to calculate the enhanced output electrical phase angle difference number $\Delta\theta_O$ by use of any enhancement function modified by the replacement of $\Delta\theta_I$ by $2\tan(\Delta\theta_I/2)$ and suitably scaled using methods well known in the art.

Again referring to FIG. 5, after the input electrical phase difference number is enhanced to create an output electrical phase difference number $\Delta\theta_O$ as shown at 53, the original input electrical phase difference number is subtracted from the output electrical phase difference number to create an angle enhancement value, as shown at 54. This value is then divided in two parts and each part is added or subtracted, as appropriate, to each input signal's phase to thereby move the signals' phases apart (in the case of expansion) and create a "more out of phase" condition between the two input signals.

The angle enhancement value may be assigned all to one input signal or split between the two input signals in any ratio. One embodiment splits the angle enhancement value equally into two parts at 54, and each half is added or subtracted, as appropriate, to each input signal's phase, thereby moving the signals' phases apart (in the case of expansion) and creating a "more out of phase" condition while preserving the same average relative output signal phase. Another embodiment splits the angle enhancement value according to the vector magnitudes so that the resulting output vector's relative phase is identical to that which would exist after vector summation if no enhancement had been performed.

Figure 7:
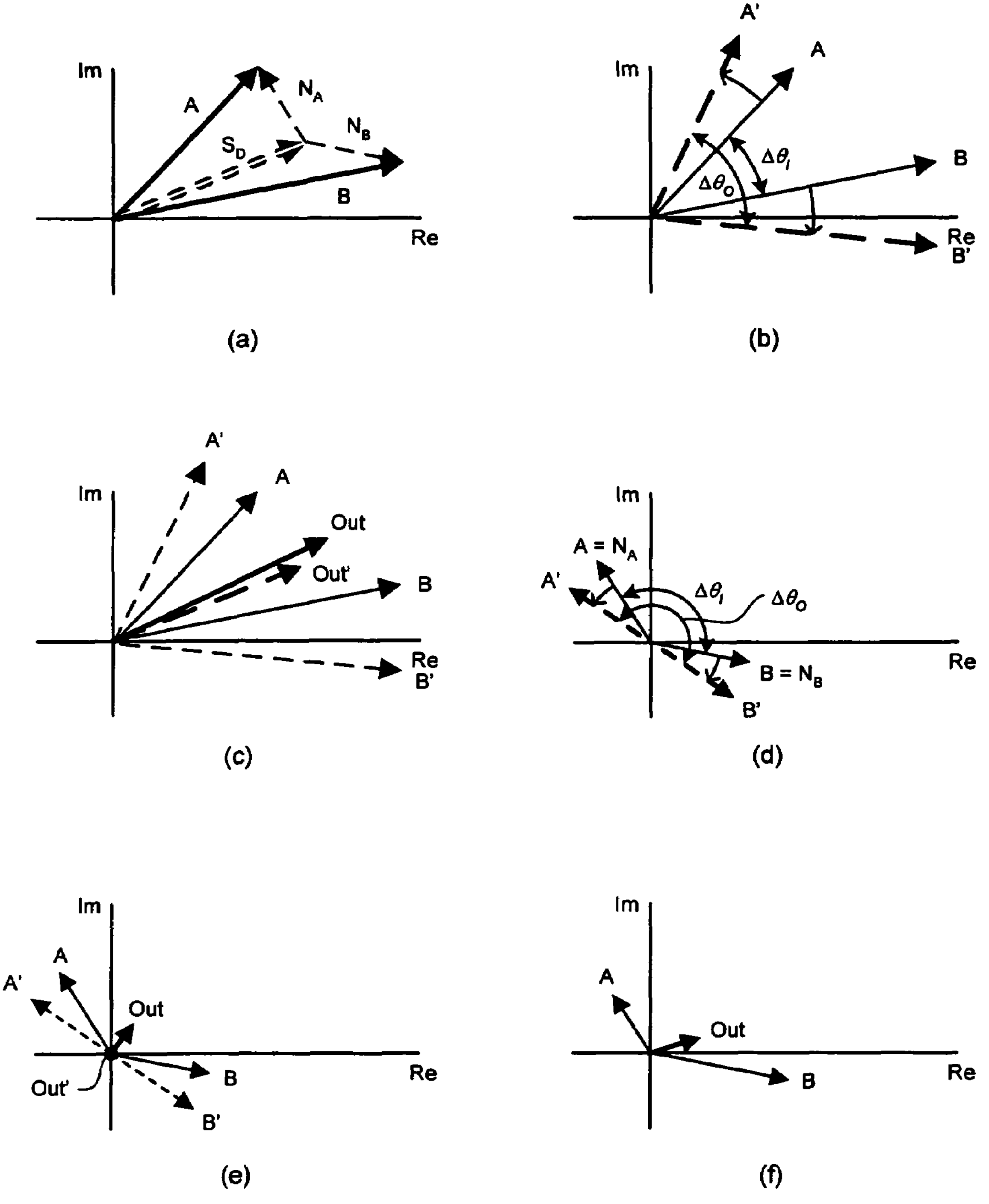
FIGS. 7A-7F are vector diagrams showing some of the inventive principles involved in combining input signals.

To illustrate this aspect of the invention, vector diagram FIG. 7(*a*) shows that signals A and B are composed of vector sums of the desired signal vector component $S_D$ and the noise vector components $N_A$ and $N_B$ respectively. Since the desired signal originates from an on-axis, time aligned source, its component is identical in both signals, as shown by the double vector $S_D$. However, since the noise signal originates from an off-axis source, the noise components $N_A$ and $N_B$ are not equal. Although their magnitudes will be equal (barring any difference in sensor element sensitivity or circuit imbalance), their electrical phases will, in general, not be equal, as shown in FIG. 7(*a*). Thus as shown, the resulting input signal vectors A and B generally will not be equal in either phase or magnitude.

FIG. 7(*b*) illustrates the expansion process described above where input vectors A and B are phase expanded (in the direction of the open arrows) from the input electrical phase difference number $\Delta\theta_I$ to the output electrical phase difference number $\Delta\theta_O$ to become the output vectors A' and B'.

After the two input signals are modified, as shown at 56 and 57 in FIG. 5, so that their complex number representations have the greater phase difference, but with their original magnitudes, they are then combined in the manner of the conventional beamforming method, as shown at 55. As previously mentioned, the two input signals are assumed to result from a sensor array system with signal delays as necessary for steering the system's sensitivity beam toward the desired signal. Therefore the input signals are time-aligned and in-phase for signals arriving from the desired source, but contain an out-of-phase component for signals originating from off-axis "noise" sources. In keeping with the principles of a standard broadside beamforming system, the vectors are then added without inversion as a vector sum to produce the output signal. In this case, the phase-expanded output vectors A' and B' are vectorially summed, as shown at 55 in FIG. 5. In other words, each $n^{th}$ bin pair of complex numbers A' and B' are vectorially added together to form the complex number placed in the $n^{th}$ bin of the output transform.

This vectorial summation process is illustrated in FIG. 7(*c*) where the output from a conventional beamformer system is shown, compared to the output from the inventive system. The signal vector labeled Out is the vector average (the vector sum divided by 2) of the original input vectors A and B. The major purpose of a noise reduction system is to remove the noise and to put out a signal that is the closest representation of the desired signal. It can be seen by comparison to FIG. 7(*a*) that the conventional beamformer output vector Out differs from the desired signal vector $S_D$ both in magnitude and phase. Any vector difference between the signals Out and $S_D$ is a vector (not shown) representing the residual noise left in the output signal after the conventional beamformer process is applied.

In contrast, the output vector labeled Out', which is the vector average of the signals A' and B' that are produced by the inventive method, is a very close match to the desired signal $S_D$. The residual noise is significantly reduced in comparison to that in the output signal of the conventional beamformer, demonstrating the significant noise reduction benefits of the inventive approach.

Figure 1:
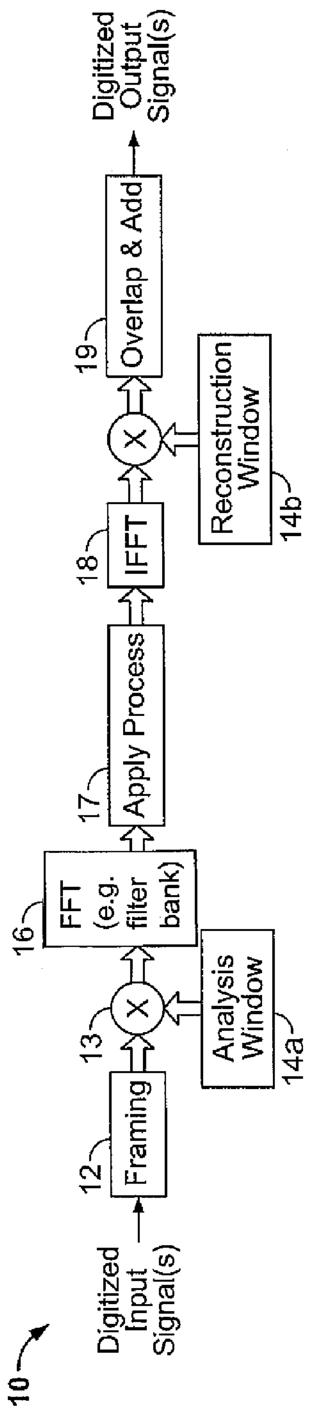
FIG. 1 is a block diagram of a conventional real-time frequency domain signal processing system 10 employing what is sometimes referred to as the frequency sub-band method or the frame-overlap-and-add method.

Once the data for all frequency bin pairs is processed according to the above method, a complete output Fourier transform frame is produced. As shown in FIG. 1 and described earlier, the output Fourier transform frame is then inverse Fourier transformed to produce a processed time domain output frame. Subsequent processed output frames are then concatenated or overlapped-and-added to produce a fully processed digitized output time domain signal.

Alternatively, the signal information in groups of bins can be first combined, for example by vector summation, to produce signal information on a frequency band basis before the signal processing calculations are performed. This is often done to reduce calculation costs for applications where the signal distortions created by band-by-band processing is acceptable. Thus it is contemplated that each calculation is performed on a bin-by-bin or on a band-by-band basis.

Figure 8:
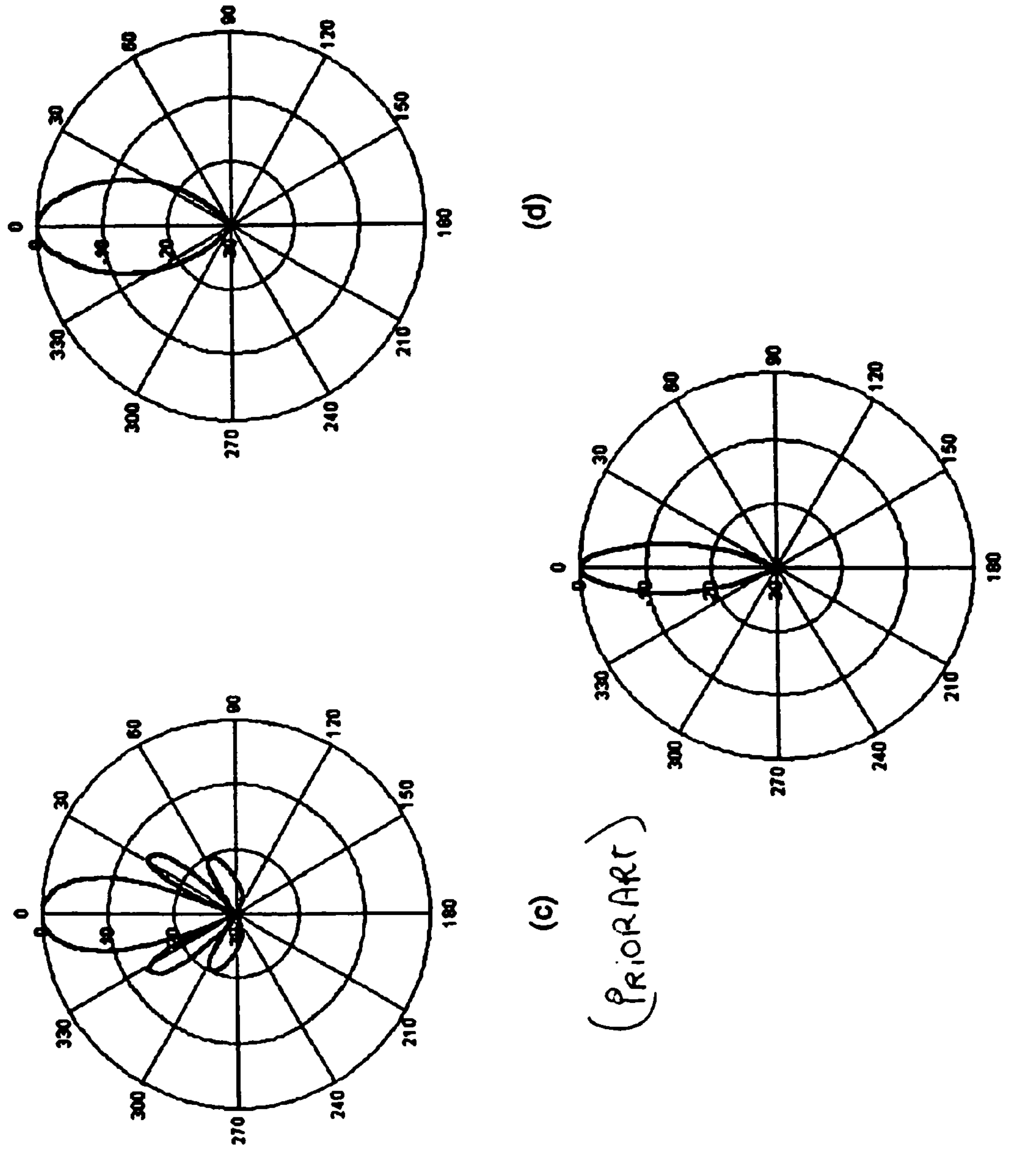
FIG. 8A is a graphical illustration of the performance of a conventional beamforming system using two cardioid microphone sensor elements spaced 7-cm apart.
FIG. 8B is a graphical illustration of the performance of a system in accordance with the invention using the same microphone array as that of FIG. 8A, and the expansion function given by Equation 1 with a sharpness value $S_D$ of 10 at 1000 Hz.
FIG. 8C is a graphical illustration showing the beam shape at 1000 Hz for a conventional beamforming system in which additional elements have been added to make the main sensitivity lobe's FWHM (full width at half maximum—a standard method of measuring beam widths) equal to that of the novel system under the same conditions as described for FIG. 8B, achieved using 13 sensor elements, all spaced 7-cm apart for a total aperture (array) size of over 85-cm (assuming readily available 6-mm diameter electret microphone elements)
FIG. 8D is a graphical illustration of an approach in accordance with the invention providing the 1000 Hz beam pattern.
FIG. 8(E) shows the 1000 Hz beam pattern produced by the novel system when the sharpness parameter S is increased to a value of 20.

FIG. 8 illustrates the beamforming performance of the inventive approach. As an example, the performance of a conventional beamforming system using two cardioid microphone sensor elements spaced 7-cm apart is shown in FIG. 8(*a*). It is readily apparent from FIG. 8(*a*) that the sensitivity beam pattern is essentially that of the cardioid elements themselves for low frequencies (below 1000 Hz) where the wavelength is large relative to the element-to-element spacing s and, thus the array aperture is much smaller than one half wavelength. At higher frequencies the beam pattern narrows, but as it narrows, side lobes are formed. For example, at 3000 Hz, a relatively narrow main lobe is formed, but several side lobes are clearly evident. Further, it is obvious that the sensitivity pattern is different for every frequency, and particularly for off-axis sounds, the sensitivity is frequency-dependent so that off-axis sound signals are changed or "colored".

In comparison, FIG. 8(*b*) shows the beam forming performance of a system in accordance with the invention using the same microphone array, and the expansion function given by Equation 1 with a sharpness value $S_D$ of 10 at 1000 Hz. Not only is the main lobe narrower than that of the conventional beamforming system, but no side lobes are produced. Furthermore, by choosing the sharpness value for each frequency bin to maintain the shape of the sensitivity pattern the same for all frequencies, the beam shape for all frequencies is the same, and there is no "coloration" to the sound from off-axis signals—such sounds are audibly "normal" but attenuated as desired.

The conventional beamforming system can not correct or "flatten" its frequency response for off-axis signals for two reasons: 1) there is no parameter available to modify the beam width as a function of frequency (whereas the novel system has the sharpness parameter S), and 2) the beam patterns show significantly different shapes for each frequency, so that even if there were a parameter for compensating the beam widths according to frequency, the beam shapes would still not match. In the inventive system, the beam shapes are essentially the same at all frequencies, allowing for easy frequency compensation by use of a proper tapering of the sharpness parameter value vs. frequency, when desired.

FIG. 8(*c*) shows the beam shape at 1000 Hz for the conventional beamforming system in which additional elements have been added to make the main sensitivity lobe's FWHM (full width at half maximum—a standard method of measuring beam widths) equal to that of the novel system under the same conditions as described for FIG. 8(*b*). To achieve this equality condition, the conventional system needs 13 sensor elements, all spaced 7-cm apart for a total aperture (array) size of over 85-cm (assuming readily available 6-mm diameter electret microphone elements). This system, although large and complex, still does not remove the side lobes of sensitivity.

In comparison, the novel approach provides the 1000 Hz beam pattern shown in FIG. 8(*d*). Not only is the beam pattern free of deleterious side lobes, but this system requires only two microphone sensor elements (with the concomitant reduction in A/D converters, preamplifier circuitry and computer processing power) and is less than 9-cm in size.

For greater noise reduction of pickup, the beam can be further narrowed and the sensitivity to off-axis noise sources further reduced. FIG. 8(*e*) shows the 1000 Hz beam pattern produced by the novel system when the sharpness parameter S is increased to a value of 20. The only limit to the practical narrowness of the beam is either when the beam is too narrow to maintain pointing at the desired source, or when the processing produces an objectionable level of distortion of the desired signal. Practical values for the sharpness parameter in voice-grade communication applications using two cardioid microphone elements ranges from about 5 to about 50, but is not limited to that range.

In the method of FIG. 5, phase enhancement processing precedes the beamforming process. Thus, the FIG. 5 method can be readily added to a conventional beamforming system between the sensor electronics and the beamforming system as shown in FIG. 2(*b*). As a result, it is clear that the above novel phase enhancement approach is highly compatible with conventional beamforming technology for improving the performance of nearly any beamforming system. For the same reasons, it is also highly compatible with conventional beam steering and beam tracking systems, as those of ordinary skill in the art will readily appreciate. Also, just as with conventional beamforming systems, the novel approach is highly compatible with the use of either omni-directional, bi-directional or uni-directional sensors or sensor arrays. For example, the novel approach can be used to beneficially combine the outputs of two or more conventional beamforming array systems. Just as well, two or more of the novel beamforming systems can provide improved input signals for further combination in conventional beamforming systems.

"Wind noise" is an especially troublesome problem in many acoustic voice signal pickup situations, for example in automobiles for telematics applications. Wind noise is different from background acoustic noises because it can not be characterized as coherent sound waves that are impinging upon the microphone sensors from a distance. Rather wind noise is characterized by pressure pulses created due to air turbulence in the near vicinity of, or at, each microphone, and/or microphone port. Thus, it is not possible to determine an angle of arrival for wind noise, since there is no correlation between the electrical phase angles of the individual sensor signals.

Nevertheless, the inventive apparatus and method disclosed in this application provides significant reduction of wind noise in its output signal while preserving the desired voice signal. Because the input signal electrical phase angle difference for wind noise can be characterized as the result of a random process, the electrical angle difference for such noise is statistically uniformly distributed over the range of possible input signal electrical phase angle differences. Since the inventive process effectively attenuates signals with input signal electrical phase angle differences that are away from the a priori known difference (typically 0 degrees) for the desired signal, wind noise is also effectively attenuated over much of the input signal electrical phase angle difference range. Such operation is highly desirable in acoustic sensor systems where wind or moving air is a problem due to the "wind noise" it creates.

A problem encountered with conventional beamforming technology is the need for sensitivity matching of the sensor signals to achieve maximum noise reduction performance. Although adequate matching of the sensor amplifiers and A/D channels is relatively straightforward, matching of the sensors themselves is not. To continue the use of the acoustic audio example, microphone elements are difficult and expensive to match, and maintaining the match across temperature changes and aging is even harder. Further, matching of sensor sensitivities at one frequency is possible, but matching over all frequencies is very difficult, even without taking temperature fluctuations and aging effects into account.

Some beamforming systems attempt to automatically match the sensor signals by applying Automatic Gain Control (AGC) amplification for each sensor channel, controlled by factory measured sensitivity differences saved in a memory system to be applied as a correction later during operation or by actively and periodically injecting matched energy signals into the sensors and correcting any sensitivity differences based upon measurements of the result of these "probe" signals.

As shown in FIG. 2(*c*), the signal sensitivity matching methods described above are usually applied to the sensor signals 22 before those signals are processed. Thus, when used with the novel system of the present invention, the sensitivity matching circuit 26 is located to precede the phase enhancement circuit 24, as shown. Alternatively, signal matching can also be applied after phase enhancement, since the enhancement circuit 24 only modifies the phase of the input signals and does not alter their magnitudes. Further, the equalization circuit 26 need not only be used for magnitude (amplitude) matching, but in addition can provide frequency equalization, when required.

Each of the prior art sensitivity matching methods has drawbacks. The AGC method can correct sensitivity differences at one frequency, but can not match the sensitivity over all frequencies. It also takes time to adjust, and this correction delay can be a problem in systems requiring rapid responses to incoming signals. The factory measured matching method can operate over frequency and without delay, but can not track sensitivity changes due to temperature, humidity or aging. The probe signal method requires that the beamforming system be taken off-line during the periodic signal injection phase of operation. In addition, all of these methods add significant cost and complexity to the system.

To demonstrate the need for sensitivity matching, consider the use of a conventional beamforming system to detect speech in noise. Speech consists of short bursts of voice sounds separated by periods of quiet—the pauses between speech bursts. It is critical that a beamforming noise reduction system reduce the effects of off-axis noises during the speech pauses, since at those times there is no voice signal to mask the effects of small amounts of residual noise and any residual noise becomes quite audible.

Referring again to FIG. 7(*a*), during a speech pause, the desired signal $S_D$ becomes zero and the input signals A and B consist only of the noise vectors $N_A$ and $N_B$, as shown in FIG. 7(*d*). In this case, the signal is only noise and the desired result is an output of zero.

When the input signals are combined in a conventional beamforming system with matched sensor signals, the resulting output signal is reduced as expected, although not to the desired value of zero. This is shown in FIG. 7(*e*) by the average output vector labeled Out which is the result of conventionally beamforming just the noise signals $A=N_A$ and $B=N_B$.

However, with a sensor signal mismatch, the residual noise in the system's output signal is significantly increased. Typical microphone elements are available with sensitivity matching at 1 kHz of ±3 to ±4 dB. Thus, in the two sensor case, if one sensor is at the low end of the sensitivity distribution and the other at the high end, the two sensor signals can be mismatched by a sensitivity difference of 2:1 or more. FIG. 7(*f*) shows the output vector that results from a conventional beamforming system where the sensors are mismatched such that sensor signal A is reduced by 3 dB and the sensor signal B is increased by 3 dB as compared to those shown in FIG. 7(*e*). In this case, the conventional beamformer output signal vector Out is significantly increased in magnitude and is significantly altered in phase. This effect results in increased audibility of the off-axis noise put out by the conventional beamforming system.

FIG. 7(*e*) also shows the residual output noise after processing by the novel system of this application, again assuming matched signal magnitudes. As is shown in FIG. 7(*d*), the relatively large input signal phase angle difference number $\Delta\theta_I$ means that the expanded output phase difference number $\Delta\theta_O$ will be very close to 180 electrical degrees. Thus, the output signal vectors A' and B' will be essentially out-of-phase but of the same magnitude, as shown in FIG. 7(*e*). When this condition is achieved, the two signals A' and B' will cancel each other when vectorially summed at 55 in FIG. 5, resulting an essentially zero length output vector as shown in FIG. 7(*e*) by the dot labeled Out'. Thus, when the sensor signals are well matched in sensitivity, the novel invention achieves the desired result of very low output for such noise-only signals. Compared to the residual noise output vector Out provided by the conventional beamforming system, the residual noise output vector Out' provided by the novel system is much smaller—that is, the residual noise in the output of the novel system is more greatly reduced.

It is to be appreciated that the novel beamforming system utilizes phase enhancement functions that include a sharpness parameter S that allows control over the beam width. Therefore, the value of the sharpness parameter can be chosen or controlled so as to produce beneficial new characteristics for a beamformer. For example, adjusting the sharpness parameter in response to an increase in the noise level can be used to narrow the beamwidth as more noise rejection is needed. The value of S can be automatically adjusted by detecting the noise in the output signal and adjusting the value to maintain, for example, a specified output signal-to-noise ratio.

Alternatively, in applications where the noise is known to have certain frequency characteristics, for example where most noise consists of low frequencies, the value of S can be adjusted to produce a wide beam at those frequencies in order to maintain the best signal quality, while a narrow beam can be created at other frequencies to maximize rejection of those noises. Such frequency tapering of the beamwidth can be fixed, manually adjusted or made adaptive or automatic by controlling the value of the sharpness parameter S in response to the variation of a control signal. There are many such ways to apply the extra freedom allowed by the sharpness parameter, and all are contemplated to be in accordance with the invention.

Further in accordance with the invention, a novel algorithmic matching method is provided to avoid the drawbacks of slow response, change tracking, added cost and complexity associated with the conventional beamformer system signal matching methods. This novel matching system provides the benefits of an instantaneous sensitivity match for all frequencies and over temperature, humidity and sensor aging conditions. Furthermore, this novel signal matching process can be applied to virtually any array system where matched signal sensitivities are needed or desired, and it is not limited to use with the novel beamforming system provided herein, although it works well in this system to assure matched signals for maximum noise reduction performance.

Figure 9:
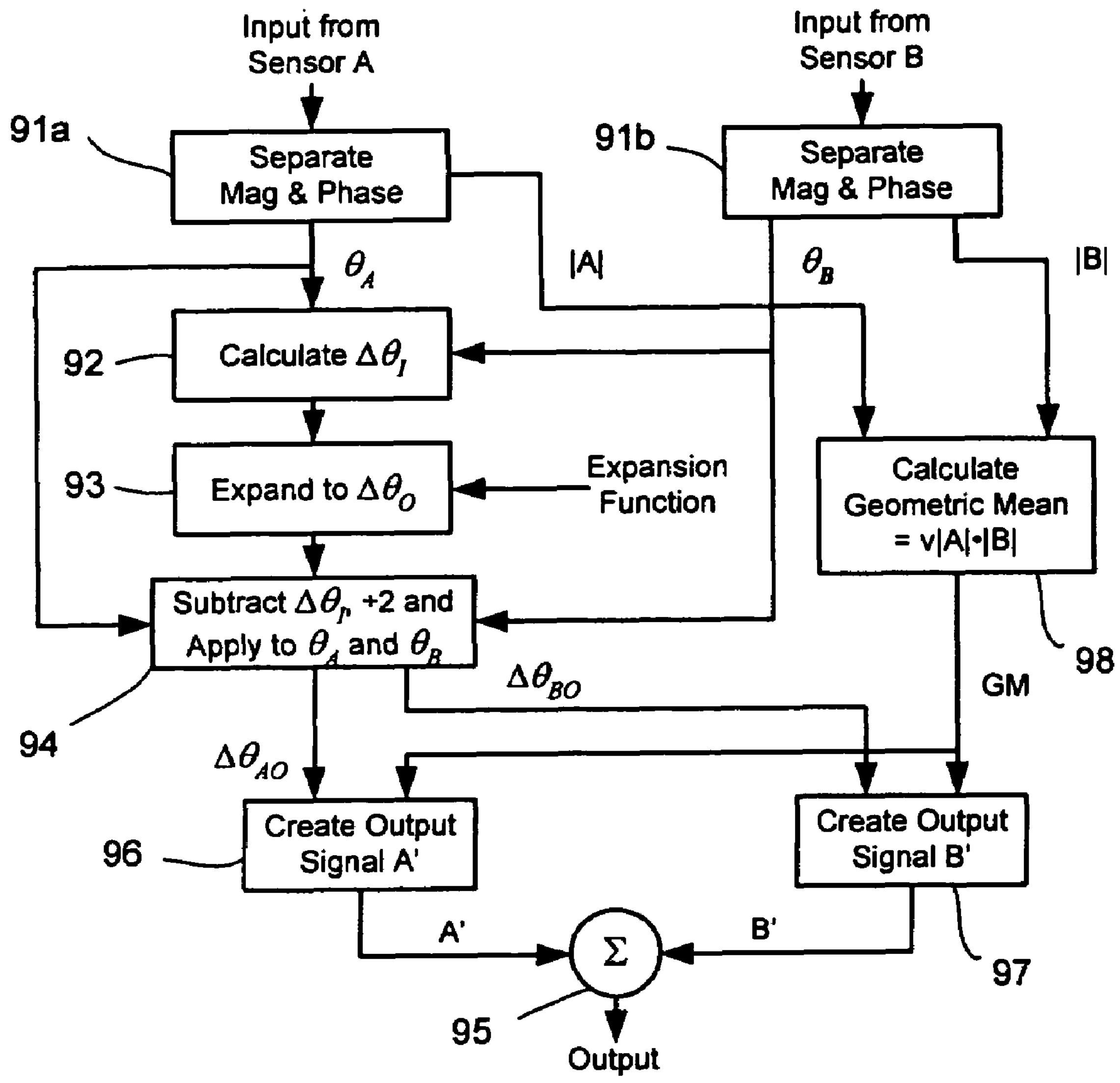
FIG. 9 is a flow diagram of a signal sensitivity matching system as implemented within the framework of a beamforming system in accordance with the invention.

FIG. 9 shows the inventive signal sensitivity matching system as implemented within the framework of the novel beamforming system. Again described in the context of a two-sensor array although no such limitation is intended, input signals A and B are first separated into their phase and magnitude components at 91*a* and 91*b*. Circuit blocks 92-97 correspond to the same blocks labeled 52-57 in FIG. 5, and represent substantially the same process steps. The signal amplitude matching is created by new circuit block 98 wherein the two input scalar signal magnitudes |A| and |B| are combined to create a new common scalar magnitude value GM equal to the mathematical mean of |A| and |B|. In this example, the geometric mean value is used. This new scalar magnitude value is then used at 96 and 97, combined with the expanded phase values $\Delta\theta_{AO}$ and $\Delta\theta_{BO}$ to produce the phase expanded output signals A' and B'.

This inventive method of compensating for sensor sensitivity mismatches and sensor signal path differences uses the process of reassigning to the magnitudes of the expanded electrical phase angle vectors the mathematical mean value of the individual magnitudes of the input vectors. There are numerous types of mathematical means, for example the arithmetic, root-mean-square (rms), geometric, harmonic and others. For the purpose of this invention all mathematical means are applicable, and a particular mathematical mean may be used as the design requires.

Use of the arithmetic mean, defined as $$\frac{1}{N}\sum_{i=1}^{N}|S_i|$$

(where $S_i$ is the signal from the ith sensor and N is the total number of sensors) produces little attenuation for highly mismatched signals, and does not extinguish the output signal if a sensor fails completely. The rms is even more forgiving in its capability to prevent attenuation of highly mismatched signals and also does not extinguish the output for sensor failures. The fail-safe characteristic of these mathematical means makes them very desirable for many real-world applications where a reliable system must continue to operate, albeit with reduced efficacy, in the event of sensor failure.

However, highly mismatched signal amplitudes are also created by undesirable multi-path, clutter or reverberation artifacts and additional attenuation of such signals is desirable in such situations. Use of the harmonic mean, defined as $$N\cdot\left(\sum_{i=1}^{N}\frac{1}{|S_i|}\right)^{-1},$$

creates relatively aggressive attenuation of such undesirable artifacts. This artifact reduction capability makes the harmonic mean a good choice for applications where clutter is a significant problem.

In contrast, the geometric mean, defined as $$\sqrt[N]{|S_1|\cdot|S_2|\ldots\cdot|S_N|},$$

provides a good compromise between the attenuation of such undesirable artifact noise signals while preserving the quality of the desired on-axis signal. In the case of human signal perception, such as in sight (light) or hearing (sounds and speech), a logarithmic mean is desirable, and the geometric mean provides this characteristic. For example, if one sensor has +X dB (greater) sensitivity than nominal while the other has −X dB (lower) sensitivity than nominal, then use of the geometric mean will provide an output magnitude equal to that provided by a matched pair of nominal sensitivity sensor elements, so that mismatches become transparent to the user.

Although the system designer will choose the preferable mean for the particular application being addressed, for acoustic voice signals the geometric mean is to be preferred.

A valuable element in this new signal sensitivity matching system is the use of a mathematical mean magnitude value to replace the individual magnitudes of the input signals. If applied to a conventional beamforming system, the phase enhancement process would be bypassed, and the original input signal phases, in this case $\theta_A$ and $\theta_B$, would be used at 96 and 97 instead.

Referring again to FIG. 2(*c*), this novel signal sensitivity matching means can be applied before, or after, the phase enhancement process. In this figure, circuit block 26 is shown before the phase enhancement block 24, but the locations can be reversed without affecting the performance of the overall system. Indeed, if the phase enhancement circuit block 24 is eliminated, then it is easy to see that the novel sensitivity matching process disclosed above can be easily added to a conventional beamforming system between the sensor electronics and the beamforming system.

Benefits of this novel sensitivity matching system are its continuous matching capability, virtually instantaneous matching, ability to continuously correct at all frequencies in real-time, without delay or dead-time, to eliminate the effects of mismatch, drift, aging, temperature, humidity and all other causes of sensitivity changes. Applicability includes radio, sonar, audio, radar, medical imaging, optics, and other array systems where matched sensors are required.

Figure 10:
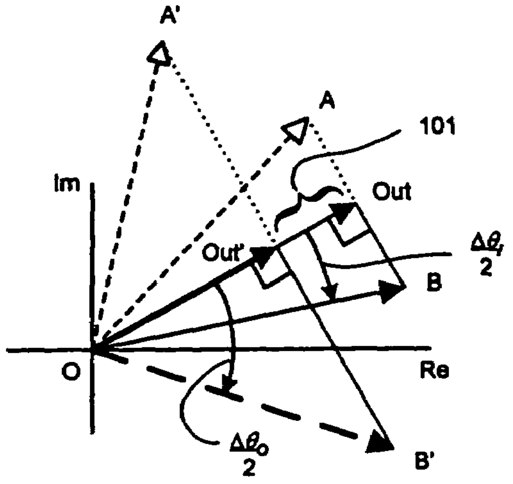
FIG. 10 is a vector diagram showing the input signal vectors A and B forming an isosceles triangle when the signal magnitudes are matched.

As shown in the vector diagram of FIG. 10, when the signal magnitudes are matched, the input signal vectors A and B form an isosceles triangle. In the conventional beamforming system, the output signal Out is created by calculating the vector average of A and B, and the resulting output signal vector bisects the triangle, as shown. Thus, a right triangle O-B-Out is formed, where the magnitude of the output signal vector Out is given by:

$$|\text{Out}| = |A|\cdot\cos\left(\frac{\Delta\theta_I}{2}\right) = |B|\cdot\cos\left(\frac{\Delta\theta_I}{2}\right). \quad (2)$$

Similarly, in the novel beamforming system, when the signal magnitudes are matched, the input signal vectors A' and B' form another isosceles triangle. The output signal Out' is created by calculating the vector average of A' and B' (at 55 in FIG. 5, or 95 in FIG. 9), and the new output signal vector Out' bisects this triangle. Thus, a right triangle O-B'-Out' is formed, where the magnitude of the output signal vector Out' is given by:

$$|Out'| = |A'|\cdot\cos\left(\frac{\Delta\theta_O}{2}\right) = |B'|\cdot\cos\left(\frac{\Delta\theta_O}{2}\right). \quad (3)$$

When phase-expansion is applied to the input signal electrical phase angle difference, the magnitude of this output vector Out' is always less than that of the conventional beamformer output vector Out, although the phase of the output signal is unchanged. Thus, with matched signal levels, the phase expansion process of the novel noise reduction beamforming system reduces the magnitude, but retains the phase, of the output signal produced by the conventional beamforming system. This reduction in magnitude is shown in FIG. 10 as the difference in vector lengths 101.

Figure 11:
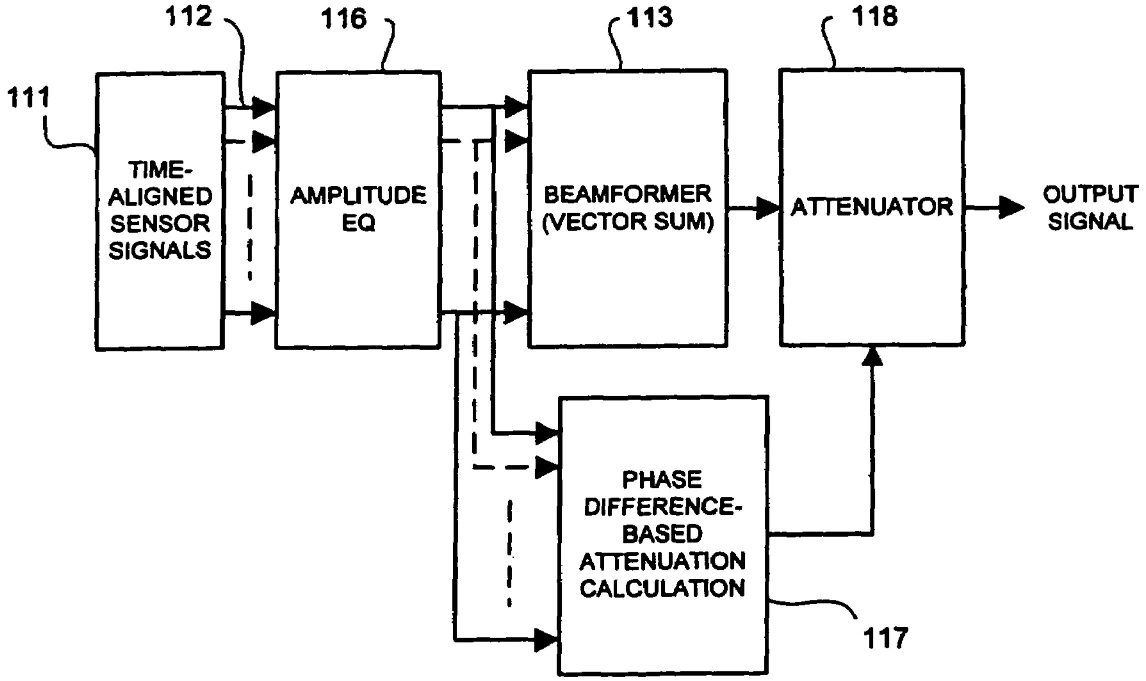
FIG. 11 is a block diagram showing a more computationally efficient approach utilizing a signal attenuation characteristic directly, instead of first calculating the expanded phase vectors A' and B', in accordance with the invention.

A more computationally efficient approach utilizes this signal attenuation characteristic directly, instead of first calculating the expanded phase vectors A' and B'. FIG. 11 illustrates this approach. As shown in FIG. 11, the input signals 112 from the sensor array 111 are amplitude matched at 116 if not inherently matched. Matching can be created by use of conventional array matching methods or by use of the novel mathematical mean matching method described above. The matched signals are then vector summed in a conventional beamformer 113 before being attenuated at 118 by an attenuation amount provided from circuit block 117. The attenuation amount is determined from the measured input signal electrical phase angle difference number $\Delta\theta_I$ at circuit block 117, as will be described. The attenuation amount is not dependent upon the magnitudes of the input vectors, or upon their absolute phases, but only upon the input signal electrical phase angle difference value or number.

Since the output electrical phase angle difference number $\Delta\theta_O$ is directly calculated from the input electrical phase angle difference number $\Delta\theta_I$ (for example, as described by Equation 1), a more computationally efficient method for creating the output signal Out' is to compute the attenuation as though the input signals are matched, and then to apply this attenuation to the output of the conventional beamforming system. Although, without signal matching, or with the conventional signal matching methods, the input signal magnitudes might not be well matched, this computationally efficient method can still be applied, but may result in an error in the phase of the output signal.

Recognizing that, for audio applications, the human ear does not readily distinguish the phase of signals, this inconsequential phase error becomes unimportant. Thus, for an audio communication device, the phase of the output signal can be slightly altered without impairing the efficacy of the system's noise reduction. Indeed, the slight deviation in output phase used in this method is likely not an issue with most contemplated applications, such as for example sonar, radar, optical, radio antenna systems and the like. However, with the novel signal magnitude matching method, phase error is not a problem, since the output signal phase will be perfectly retained.

As seen in FIG. 10, the amount of attenuation to be applied is the ratio of the magnitudes of the output vectors Out' and Out. Since the signals A' and B' are assumed to be sensitivity matched and equally expanded, the output vectors Out' and Out have the same electrical phase angle, as shown in FIG. 10. Therefore, the ratio of their magnitudes, from Equations 2 and 3, becomes a simple scalar attenuation value defined as $$Attn = \frac{\cos\left(\frac{\Delta\theta_O}{2}\right)}{\cos\left(\frac{\Delta\theta_I}{2}\right)}. \quad (4)$$

Since $\Delta\theta_O$ is a function of $\Delta\theta_I$, the attenuation value is only a function of $\Delta\theta_I$.

Figure 12:
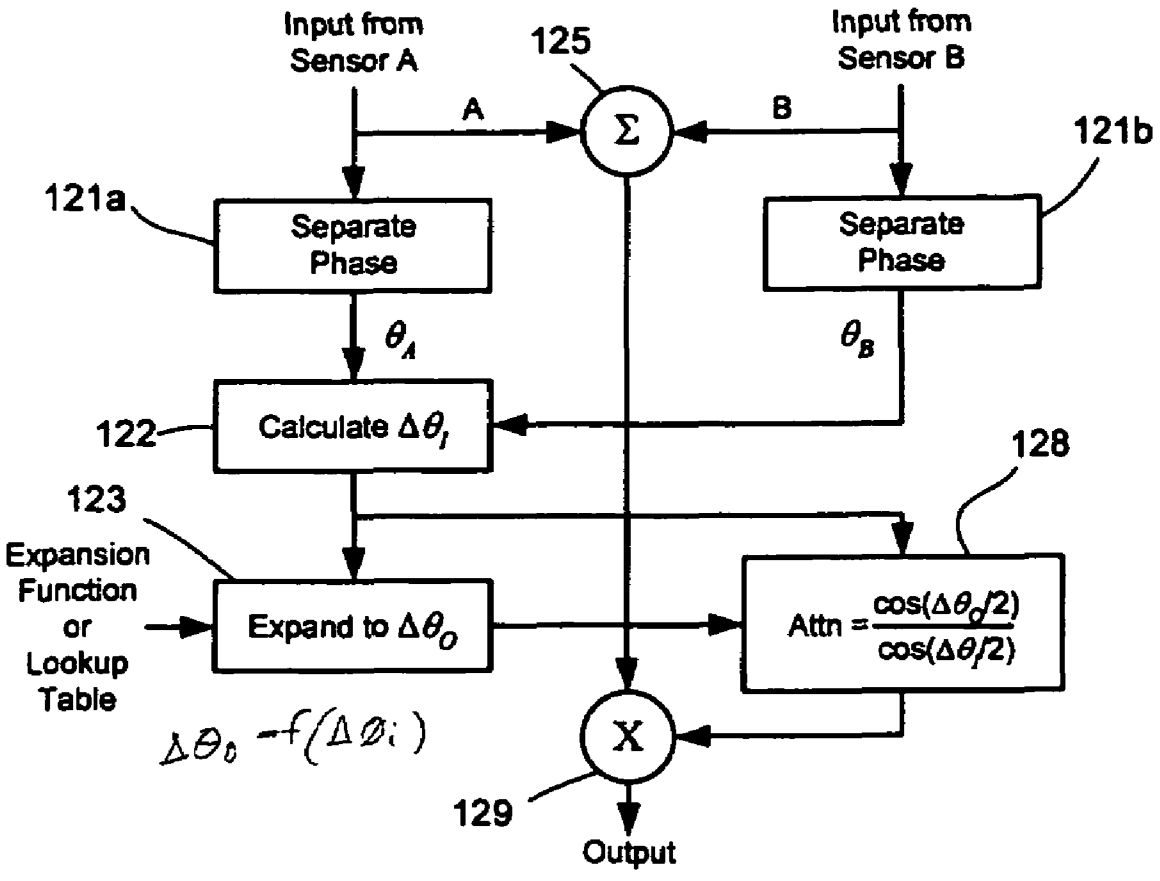
FIG. 12 is a flow diagram showing how the attenuation ratio can be used to provide another way of implementing the inventive noise reduction method.

FIG. 12 shows a flow diagram of how this attenuation ratio can be used to provide another way of implementing the inventive noise reduction method. Using Equation 4, plus a relevant phase enhancement function for determining the expanded output electrical phase difference number $\Delta\theta_O$, an attenuation value can be determined from the input electrical phase angle difference number $\Delta\theta_I$. This attenuation value is then used for modifying the output from a conventional beamformer to produce the same noise reduced output as is produced by the phase enhancement method. In this method, the two input signals are first vector summed at 125 to produce an un-attenuated intermediate signal. Using only the input signal electrical phases at 121*a* and 121*b*, the input electrical phase difference number $\Delta\theta_I$ is calculated at 122 and subsequently used, along with a phase enhancement function or lookup table, to calculate the output electrical phase difference number $\Delta\theta_O$. The attenuation value is then calculated according to Equation 4 at 128.

When the input signals are from the desired on-axis source, the two electrical phase difference numbers are equal and the attenuation value equals unity, resulting in this desired signal being passed without attenuation. When the input signals are from an off-axis noise source, the two electrical phase difference numbers are unequal, with the output electrical phase difference number always being larger than the input electrical phase difference number. Because the phase difference numbers are divided in half, they lie on the interval $-\pi/2 \leqq \Delta\theta \leqq \pi/2$ and always have the same sign. Thus, the attenuation value for such signals, according to Equation 4, will be less than one, and will decrease toward zero as the input noise signal arrival azimuth angle increases away from the array axis toward 90 degrees.

Figure 13:
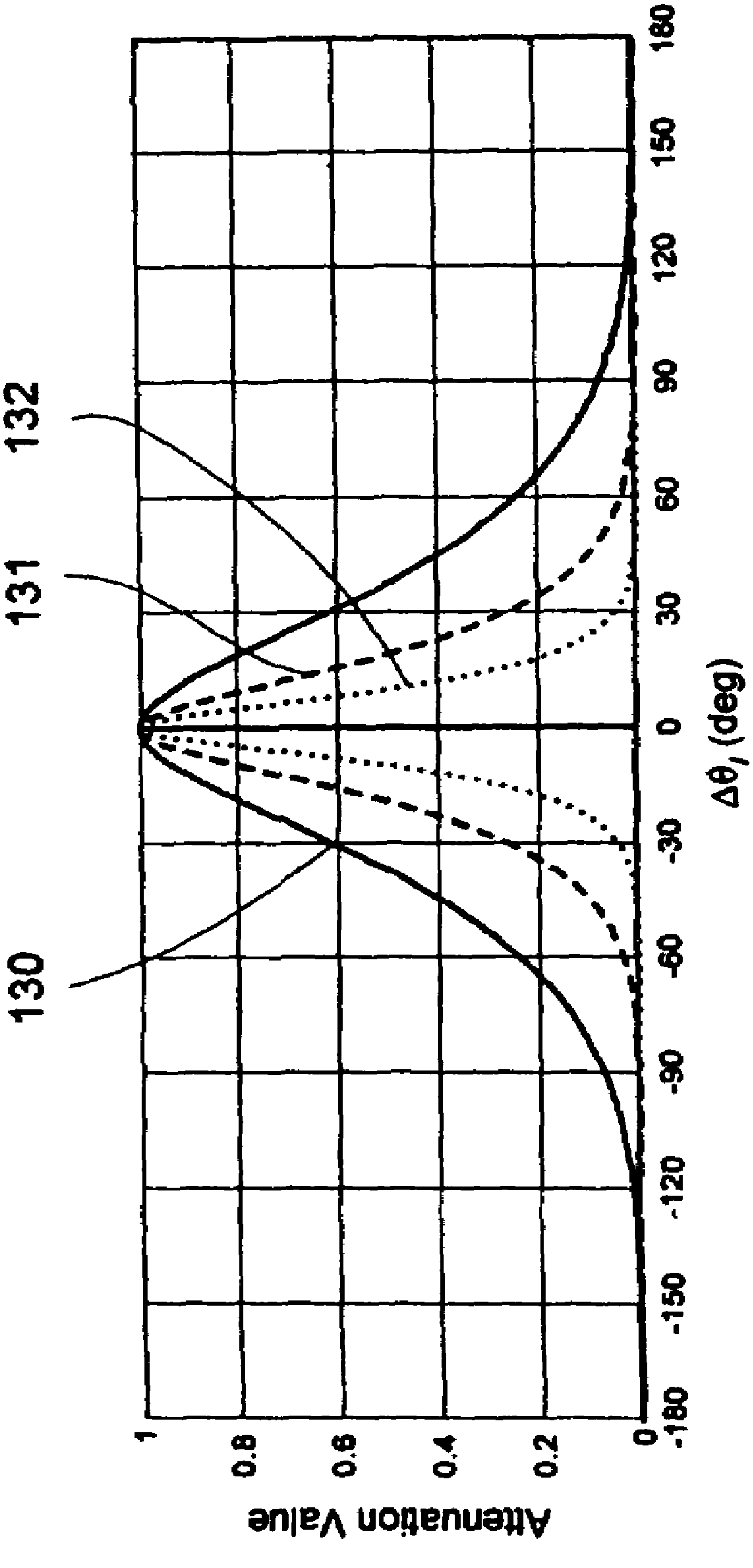
FIG. 13 is a graph of the attenuation value created, using Equation 4, and the phase enhancement function of Equation 1 in accordance with the invention.

As an example of this attenuation characteristic, FIG. 13 shows a graph of the attenuation value created, using Equation 4, and the phase enhancement function of Equation 1 (which is graphed in FIG. 6(*a*), for different values of the sharpness parameter S). The horizontal axis of this graph is the input electrical phase difference number $\Delta\theta_I$, while the vertical axis is the attenuation value. Curves 130, 131 and 132 illustrate the attenuation value as a function of the input signal electrical phase difference number for sharpness values of 5, 10, and 20 respectively. Notice that the attenuation value is-equal to unity at an input electrical phase difference number of zero degrees, since this represents the phase difference for a desired signal. As the input electrical phase difference increases away from zero in either direction, the attenuation increases—that is, the attenuation value decreases toward zero.

Again referring to FIG. 12, after calculation of the attenuation value at 128, the conventional beamformer intermediate signal vector from 125 is multiplied by the scalar attenuation value at 129 to produce the final attenuated output signal. Thus, as the input electrical phase difference number increases away from zero in either direction, the conventional beamformer output signal is attenuated, since such input signals must be from off-axis noise sources. As with the phase expansion process of the inventive method, this attenuation process similarly removes the effects of off-axis noise sources in the output signal of the system.

It should be noted that this attenuation method saves computation at 121*a* and 121*b* by not requiring the calculation of the magnitudes of the input signals A and B, and further saves the calculation of the phase expanded output vectors A' and B'. However, it still requires the calculation of the expanded output phase difference number $\Delta\theta_O$. A further saving in computation can be made by using an attenuation function, rather than a phase expansion function such as those previously described.

Although less intuitive, this very computationally efficient approach accomplishes the same noise reduction as the previously described approaches of the inventive system. This approach will be described with reference to FIG. 14.

Remembering that the input signals A and B are Fourier transform bin/band values, the inputs are vectors represented by complex numbers with a real and an imaginary part. At circuit 140, the square root of the ratio of the magnitude of the input signal A to the magnitude of the input signal B is calculated—that is, the output of circuit 140 is the scalar value:

$$Output140 = \frac{\sqrt{|A|}}{\sqrt{|B|}}$$

This scalar value Output 140 is used at circuit 141, to divide the input vector A, whose magnitude is |A|. The result is that the output vector signal from circuit 141, the vector signal A''', has a magnitude equal to the geometric mean of the magnitudes of the two input vectors A and B, but the electrical phase angle of input vector A. The scalar value from 140 is also used at circuit 142 to multiply input vector B, resulting in the vector signal B''', whose magnitude is also the geometric mean of the magnitudes of the two input vectors, but whose electrical phase angle is the same as that of input vector B. It will be appreciated that the method shown in FIG. 14 inherently provides geometric mean magnitude equalization which serves to correct for the unmatched character of the two sensors.

The two geometric-mean magnitude matched vector signals A''' and B''' are then summed at 144 to obtain the un-attenuated intermediate output vector, while the vector difference of A''' and B''' is obtained at the output of circuit 143. Remembering that the vector difference divided by the vector sum is equal to the imaginary operator ($\sqrt{-1}$) times the tangent of half the angular difference, the circuit 145 computes this ratio—that is, the signal T is:

$$T = \frac{A''' - B'''}{A''' + B'''} = i \cdot \tan\left(\frac{\Delta\theta_I}{2}\right).$$

The imaginary operator is removed at circuit 146 by taking the magnitude of T, resulting in a scalar value equal to the tangent. This tangent of one half of the input electrical phase difference number $\Delta\theta_I$ is then used at circuit 147 to calculate the attenuation by application of an attenuation function or lookup table. Once the attenuation value is determined from the function or table, it is applied to the intermediate output vector signal from circuit 144 by multiplying the vector signal by the attenuation value. This produces the final output from the noise reduction process.

Figure 15:
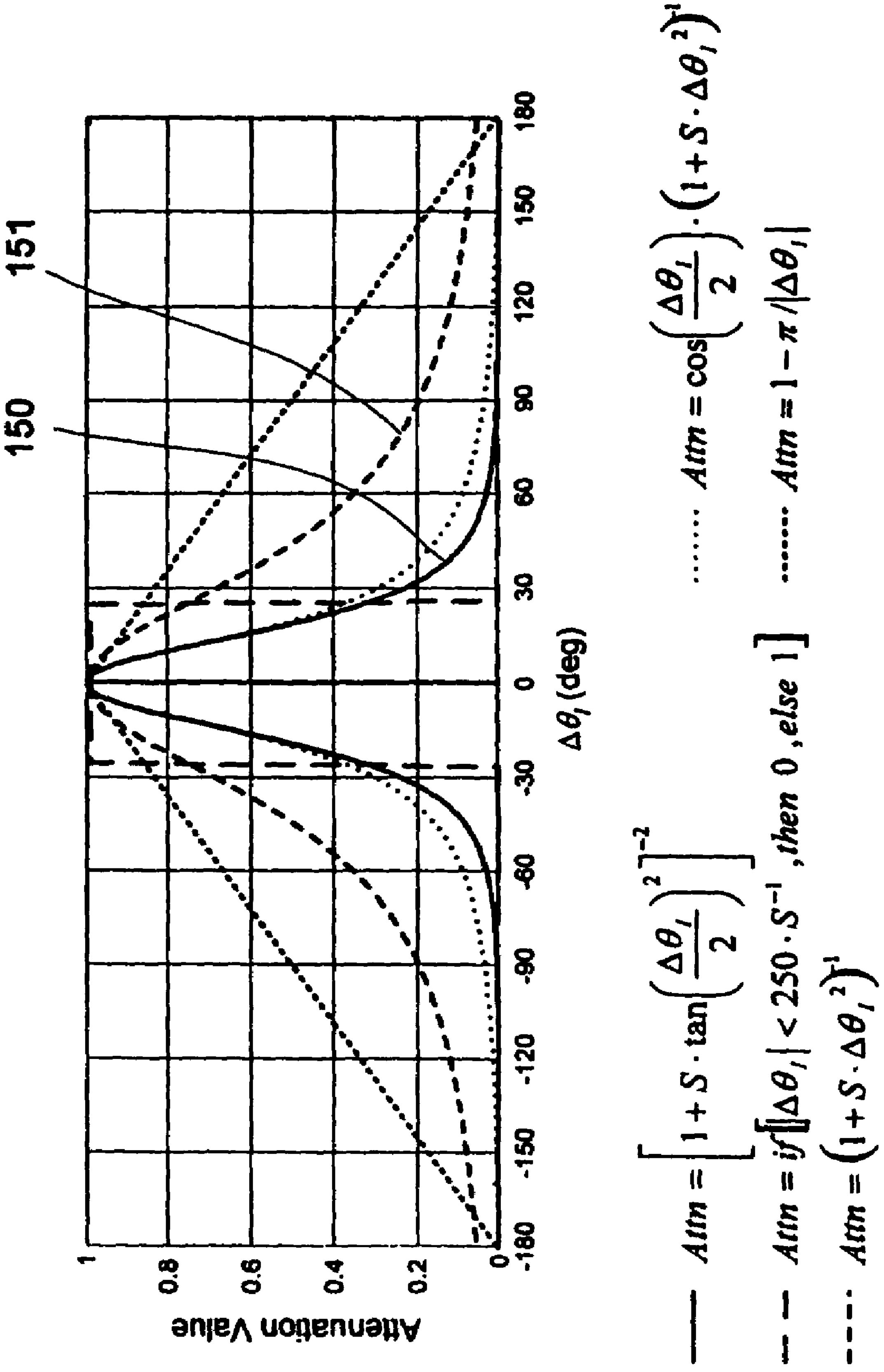
FIG. 15 is a graph of, and the defining equations for, some typical attenuation functions that can be used with a beamforming noise reduction system in accordance with the invention.

FIG. 15 shows a graph of, and the defining equations for, some typical attenuation functions that can be used with this novel beamforming noise reduction system. As was discussed with reference to various curves shown in FIG. 13, the attenuation value for an input electrical phase difference number of zero degrees is one—in other words such a signal is passed without attenuation. Thus, a desired signal, one that originates from a position along the array sensitivity axis, is not attenuated. However, as the input electrical phase difference number increases in either direction away from the zero value, additional attenuation is created, since the attenuation value drops below the value of one and toward the value of zero. Thus, signals originating from off-axis noise sources are attenuated.

As noted by curve 151 of FIG. 15, the attenuation value need not reach zero for any input electrical phase difference, including an input electrical phase difference of 180 degrees. Furthermore, the attenuation need not fall monotonically to either side of zero degrees. Indeed many other functions and curves can be used, as long as there is attenuation for at least some input electrical phase difference numbers away from zero.

Figure 14:
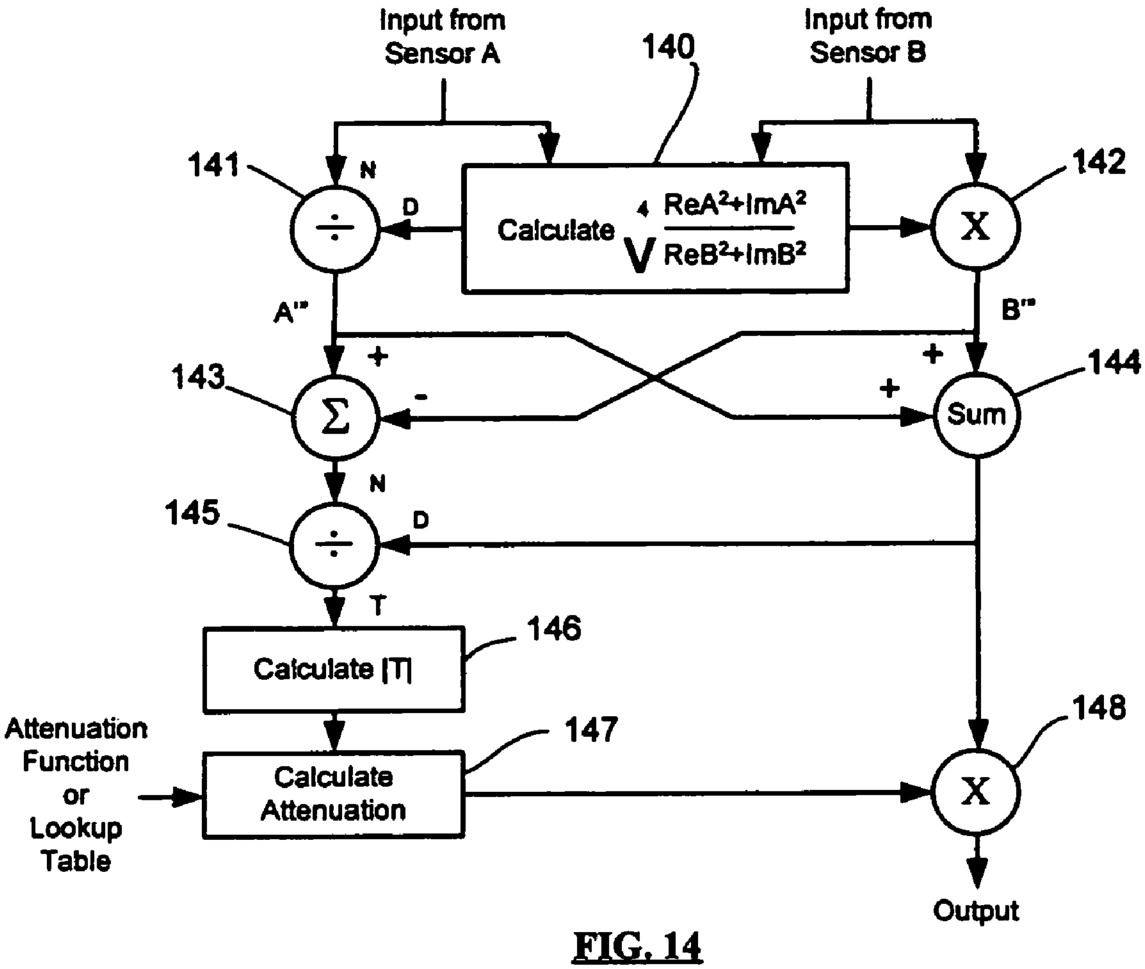
FIG. 14 is a flow diagram of a computationally efficient approach for accomplishing noise reduction in accordance with the invention.

The attenuation function shown by the solid graph curve 150 of FIG. 15, is especially interesting for use with the method described with respect to FIG. 14. This is because, as shown in the defining equation for that curve, the attenuation value is determined by the tangent of one half of the input electrical phase difference number, $\Delta\theta_T$, which is the signal that is inherently available at the input of circuit 147 in FIG. 14.

This function also promotes efficient calculation because the sharpness parameter is used in a simple multiplicative manner, rather than as a power. When this, or a similar, attenuation function is used in the method of FIG. 14, very simple and efficient computation results. Functions incorporating multiplicative use of the sharpness parameter are highly desirable because of their low computational power requirements.

The forgoing discussion has described a method of determining applicable attenuation values by calculation of the attenuation values from functions. Alternatively, the attenuation values can be obtained from a lookup table of pre-calculated values at circuit block 147. In such an implementation, the computational overhead of calculating the values from a function is eliminated. This method provides even greater real-time computational efficiency, although at the expense of reducing the ability to make real-time changes to the attenuation table values in response to changing conditions.

This discussion has addressed only a few examples of the possible attenuation formulas and curves, and is not intended to be limiting. Formulae that include the point 0,1, and curves that pass through the point 0,1, and increase the attenuation at other points conform to one aspect of the invention. Formulae and curves that maintain no attenuation at some other selected point, and increase the attenuation at other points conform to another aspect of the invention. In accordance with a further aspect of the invention, attenuation is only applied for some input phase angle difference number values $\Delta\theta_T$. In practice, attenuation will likely be applied, to a greater or lesser extent, to most values, although it will be recognized that there is no requirement that attenuation be applied to most or even a substantial portion of the values. Further, for systems in which a symmetrical attenuation function is applicable, the calculation of the attenuation can be simplified or the look-up table minimized by using just the magnitude of the input phase angle difference number values $\Delta\theta_T$. Further, re-wrapping of the input phase angle difference value $\Delta\theta_T$ is unnecessary when attenuation functions that repeat over intervals of $\pi$to $2\pi$ and $-2\pi$ to $-\pi$ are used. The above are exemplary modes of carrying out the attenuation method and are not intended to be limiting. It will be apparent to those of ordinary skill in the art that modifications thereto can be made without departure from the spirit and scope of the invention It should be noted that the maximum value of the attenuation value need not be equal to one. If the maximum value is made equal to a lower value so that the attenuation values are scaled to fit the range from zero to this lower value, then the beam shape enhancement will be retained, but the overall sensitivity will be lowered. Similarly if the maximum value is made equal to a higher value than one so that the attenuation values are scaled to fit the range from zero to this higher value, then although the beam shape is again unchanged, the overall sensitivity will be increased. It should be noted that the term "attenuation" is still applied even when the attenuation value is greater than one, although in such a situation the opposite of attenuation is taking place. In other words, a signal that is multiplied by an "attenuation" value greater than one is actually being magnified (undergoing a gain), rather than attenuated. Nevertheless, the term attenuation will be used herein. This leads to a simple method for gain control that can be easily integrated into the attenuation method of implementing the novel beamforming process. Such gain control, for example, can be used for Automatic Gain Control of such a system with an appropriate control signal, as is well known in the art. There are many applications where gain control, including AGC, is of great benefit.

Further in accordance with the invention, a phase difference other than 0° can be used as the phase difference for which no phase enhancement or attenuation occurs, using a function that provides phase expansion or attenuation elsewhere. In this manner, the direction of maximum sensitivity is steered to an angle corresponding to an azimuthal angle other than that which produces 0° of electrical phase difference. With other parameters held constant, changing the input signal electrical phase difference at which no phase enhancement or attenuation is applied shifts the azimuthal angle of maximum sensitivity of the sensor system.

The attenuation curves 130, 131 and 132 of FIG. 13 demonstrate no attenuation at the on-axis "look" direction of 0 degrees for the input signal electrical phase angle difference number, but demonstrate signal attenuation for input signal electrical phase angle difference numbers that are away from 0 degrees. Another use for the inventive apparatus and method is to provide a new way of beamsteering. Conventional methods of beamsteering require the application of time-delay techniques, and/or their equivalent in the frequency domain. Instead for example, if the curves shown in FIG. 13 are displaced laterally so that zero attenuation occurs at an angle other than 0 degrees, as illustrated by curve 133, then the effective beam is moved, or "steered", to this new angle where the attenuation is zero.

Such steering can be accomplished in a fixed manner, or dynamically in real time by applying an attenuation function that shifts its peak laterally in real time as needed, or in response to the control signal from a beam tracking system (not shown). Remembering that Equation 4 shows that there is a corresponding phase expansion function for every attenuation function and vice versa, it will be obvious to one skilled in the art that this new form of beamsteering can also be accomplished by utilization of an appropriate (or corresponding) phase enhancement function along with the phase enhancement methods described above.

Further, there are numerous beamformer applications in which multiple simultaneous beams are required, for example in sonar and radar applications. Using attenuation functions with two or more no-attenuation peaks, but with finite attenuation between those peaks, can produce multiple-beam pattern sensitivity peaks or beams. Similarly, those beams can be steered, and each can be steered independently, by dynamically moving the lateral locations of the attenuation function peaks as required, for example, in response to an appropriate control signal (which could be a beamtracking control signal). Also as described above, this multiple beam apparatus and method can be accomplished with the phase expansion method previously described in detail by use of the corresponding phase expansion function.

An example of an excellent application for this technique is the super-resolution beamformer, where the deleterious effect of the signal sensitivity side lobes in a first beamformer's sensitivity pattern is reduced or cancelled by adding an appropriately scaled and inverted signal from a second beamformer of the type just described to the signal from the first beamformer. To accomplish this cancellation, the second beamformer's sensitivity pattern would mimic the side lobes of the first. Thus, the side lobes of the first beamforming system are effectively cancelled using this means, leaving just the narrow main lobe of sensitivity.

All beam forming systems create some amount of distortion of the desired signal. As such a system becomes more aggressive—that is, as it produces a narrower sensitivity beam pattern—the distortion increases. For the inventive system, the distortion that is created becomes measurable, but only for high values of the sharpness parameter, S. Thus, it is valuable to attempt to minimize the value of the sharpness parameter, S, whenever possible, in order to minimize the distortion, and the tradeoff of increased distortion can be balanced with increased sharpness parameter in accordance with the particular application.

As described above for implementing the inventive signal process, both the phase expansion and the phase-based attenuation methods have been shown with symmetrical improvement functions, for example as shown in FIGS. 6, 13 and 15. However, the improvement functions, whether implemented in direct calculation form or in look-up table form, need not be symmetrical. Certain applications can benefit from the use of an asymmetrical beam pattern; for example in an optical application when trying to resolve the signal from a faint star next to a bright star. A narrower beam or greater attenuation to the side of the bright interfering star can attenuate the interference from this "noise" source, while providing the normal beam or attenuation in all other directions, thus minimizing the distorting effect of the high values of sharpness used to produce the narrower beam. In this manner enhancement or attenuation is conducted asymmetrically about a selected phase angle difference, which, in the case of curves 130-132 (FIG. 13) for example, is zero degrees, while in the case of curve 133, it is a value other than zero degrees.

Such an asymmetrical directionality improvement can be created by, for example, using one sharpness value for positive input signal phase difference values while a different sharpness value is used for negative input signal phase difference values. Similarly, one improvement function or table can be used for the positive side while another is used for the negative side.

Further, the value of the sharpness parameter S can vary with frequency. For example, using a single value for all frequencies creates a beam pattern that is relatively broad at low frequencies, but becomes narrower at higher frequencies. This is because the wavelength of a signal varies inversely with frequency, and therefore the input electrical phase difference for an off-axis signal varies linearly with frequency.

The beam width can be made equal for all frequencies by correcting for this effect. One means of correcting for this effect is selecting a different sharpness parameter value for each frequency in such a manner as to compensate for the change. For example, the uniform beam-width shown in FIG. 8(*b*) occurs when the sharpness parameter, S, is adjusted as the inverse of the frequency difference. When the 1 kHz sharpness parameter is set to a value of 10, at 500 Hz the same beam width is created by a sharpness value of 20, and at a frequency of 2 kHz the required sharpness value is 5. Therefore, by choosing the sharpness parameter value as a function of frequency, virtually any desired frequency response for off-axis sensitivity can be created.

For applications in which a symmetrical improvement applies or is desirable, the computational cost can be reduced by exploiting the symmetry. Using the magnitude of the input signal phase difference value to determine the amount of noise improvement can remove the need for calculating the signum $\mathrm{sgn}(\Delta\theta_I)$ function, for example as in Equation 1, or can reduce the size of a look-up table by a factor of two.

Generally, the microphone spacing (s, in FIG. 4) would be one-half wavelength or less at the highest frequency of interest. This is because the calculated input signal electrical phase difference should not exceed ±180°. When the difference exceeds ±180°, the value becomes ambiguous. For example, if the sensor spacing were equal to a full wavelength and a noise source was located at an azimuth angle of 90°, the true value of the input signal electrical phase difference, $\Delta\theta_I$, would be 360°. However, the calculation of the input signal electrical phase difference would create a mathematical value of 0° and the resulting signal then would not be attenuated. The result is that the resulting sensitivity beam has side lobes at frequencies exceeding that at which the spacing is one-half wavelength. This is not necessarily undesirable in some applications, for example, in applications where all important noise sources have frequency content below the frequency where the sensor spacing is one-half wavelength, but the desired source has content above that frequency.

Figure 16:
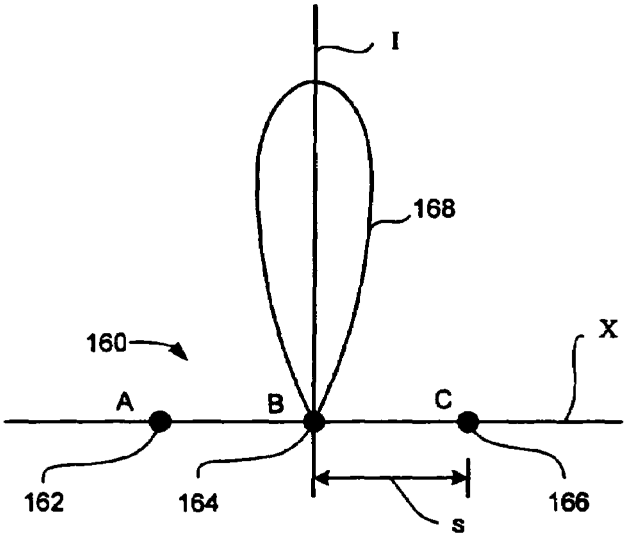
FIG. 16 is a schematic diagram showing a method for both extending the novel method to linear broadside arrays of greater than two elements, a means for resolving the input signal electrical phase difference ambiguity created by greater sensor spacings.

However, for other applications, without a means of calculating the true input signal electrical phase difference, such larger sensor spacings can be a problem. FIG. 16 shows a method for both extending the novel method to linear broadside arrays of greater than two elements, but also a means for resolving the input signal electrical phase difference ambiguity created by greater sensor spacings. FIG. 16 shows an array, 160, having three sensor elements, A (162), B (164) and C (166), wherein the sensor-to-sensor element spacing, s, is one-half wavelength, but the array width is one full wavelength. Here the system determines the input signal electrical phase differences between all sensor signal pairs, A-B, B-C and A-C, wherein the inner pair electrical phase differences, A-B and B-C, are always between ±180°, but the outer pair difference ranges over the interval ±360°. The inner pair electrical phase difference values can be averaged or used singularly as a coarse measure of the azimuthal angle of arrival, while the outer pair electrical phase difference value is used as a fine measure of the angle of arrival. While the inner pair phase difference value(s) resolves the ambiguity, the outer pair phase difference value is used to produce the phase expansion or phase-based attenuation of the noise. Thus, a greater narrowing of the effective beam 168 can be achieved without additional distortion of the desired signal. This method can be extended to any size array with any number of elements, whether spaced uniformly or non-uniformly.

Figure 17:
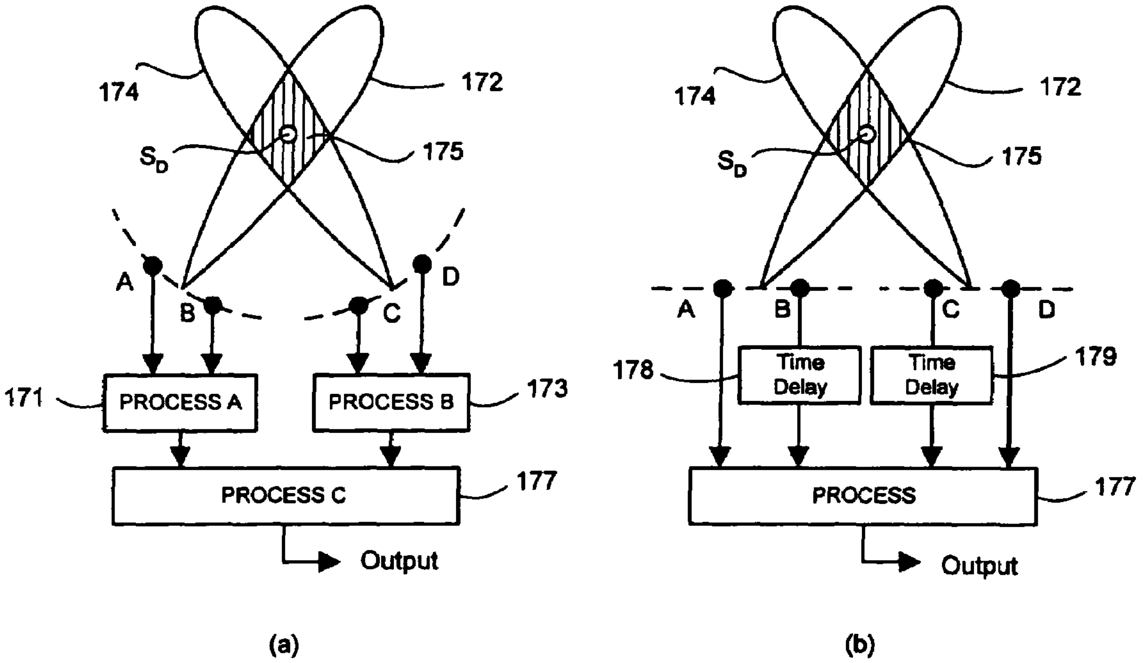
FIGS. 17A and 17B are schematic diagrams of two approaches for producing a range sensitive beam pattern in accordance with the invention.

In the aforementioned configurations, the novel technology is equally sensitive to all signal sources lying on the sensitivity axis I regardless of their distance from the array, and only attenuates signals based on their angle of arrival. However, in many applications it is desirable to also provide a means for accepting only signals originating from a specific distance, or "range". FIG. 17 shows two methods for producing a range sensitive beam pattern in accordance with the invention.

Figure 18:
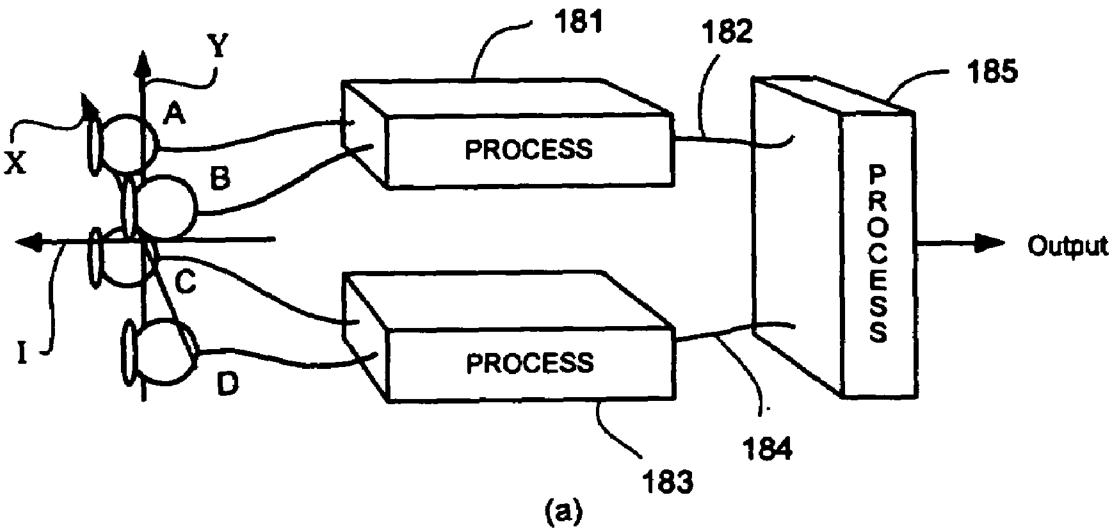
FIGS. 18A-18C are schematic diagrams of three different approaches for creating a "pencil" beam—that is, a beam with both reduced azimuthal (width) and reduced elevational (height) extent—in accordance with the invention.
Figure 18:
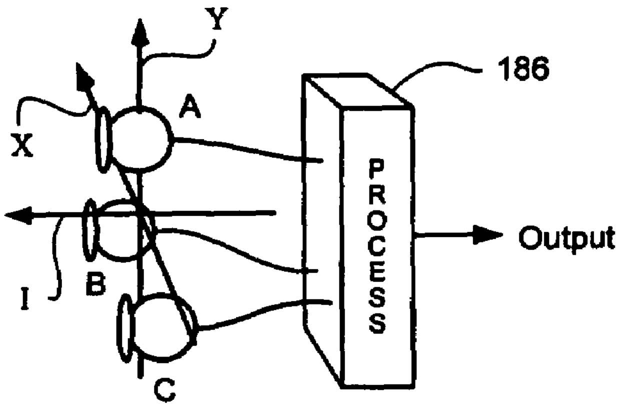
Figure 18:
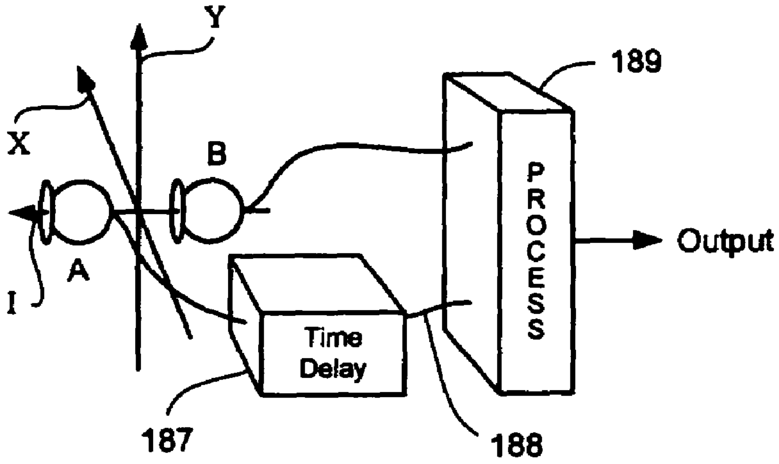
Figure 19:
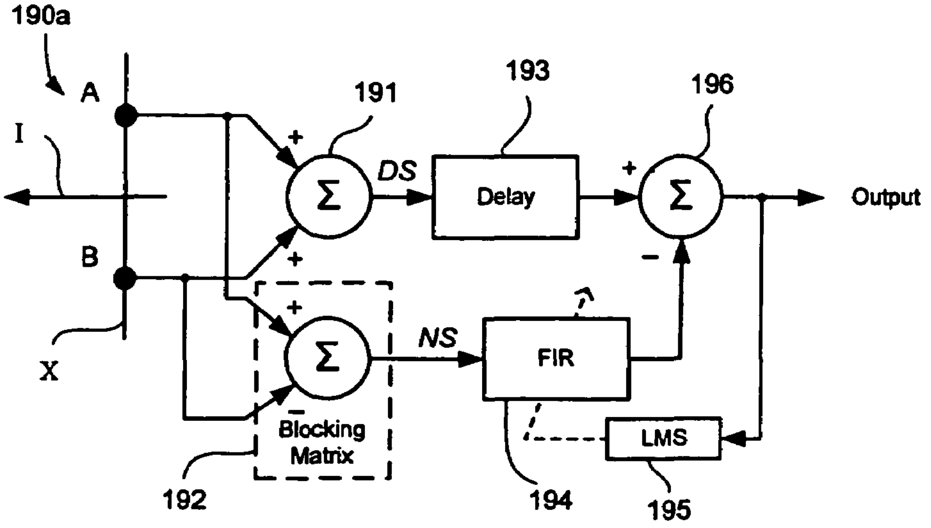
FIG. 19A is a schematic diagram of a prior art two-element noise reduction system.
FIGS. 19B and 19C are schematic diagrams showing the inventive use of phase enhancement process in a Griffiths-Jim beamformer arrangement.
Figure 19:
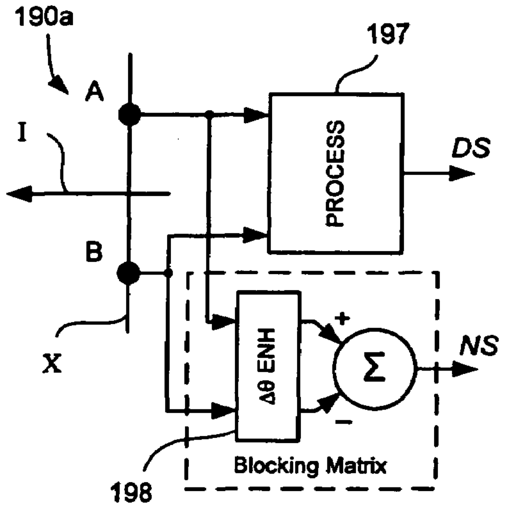
Figure 19:
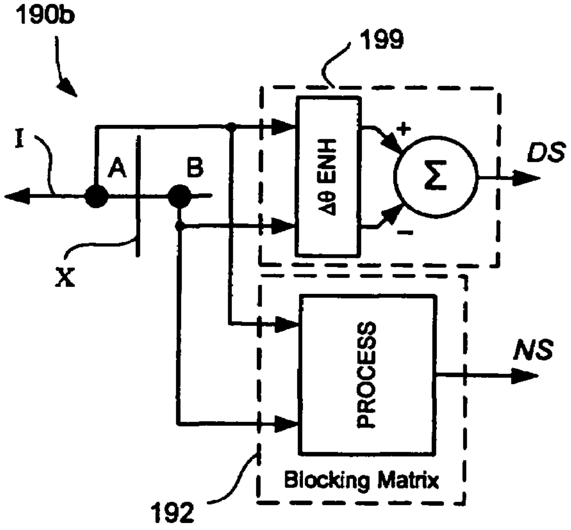

In FIGS. 17, 18 and 19, circuit blocks labeled PROCESS implement the novel beamforming process of this invention, using any of the disclosed methods including the phase enhancement and/or attenuation methods. Similarly, circuit blocks labeled Δθ ENH implement just the phase enhancement process of this invention using any of the disclosed methods. Such uses of the inventive processes are not intended to be limiting.

In FIG. 17(*a*), a desired source, $S_D$, is shown located within region 175 at a distance from the array formed by the four sensors A, B, C, and D. Sensors A and B, along with PROCESS 171, form a first one of the inventive beam forming systems that produces beam 172. Sensors C and D, along with PROCESS 173 form a second one of the inventive beam forming systems that produces beam 174. The sensors are all located at the same distance from the desired source $S_D$ (as shown) or their signals may be time aligned for the desired source, using conventional signal time alignment techniques. The signals put out from these first and second beam forming systems are combined in a third one of the inventive processes, PROCESS 177, to produce the final output signal. In such a way, only signals originating from sources within the sensitive region 175 are detected, while the signals from "noise" sources located outside the sensitive region 175 are attenuated. Therefore, both angle and range resolution are achieved by such a system.

In such a system, the circuit blocks labeled PROCESS need not be the same. For example, the process at 171 and 173 could implement the phase enhancement method, while the process at 177 could implement the attenuation method. Further, one or more of the process circuit blocks can be implemented as a conventional beamformer.

FIG. 17(*b*) shows a simpler method for creating range resolution using the inventive method. Similar portions of FIG. 17(*b*) are labeled with the same designations as used in FIG. 17(*a*). Here the sensors lie on a straight line, and time delay circuits 178 and 179 are used to steer the two beams 172 and 174 inward, as shown. Thus, all sensor signals become time aligned by this means. Alternatively, the sensors can be located at equal distances from the desired source, as shown in FIG. 17(*a*) thereby removing the requirement for the time delays shown in FIG. 17(*b*). When the signals produced by the sensors are thus time aligned, they can be used in a single beamforming process PROCESS 177 where the input signal electrical phase difference values for signal pairs A-B and C-D are first determined. In addition, all four signals arriving at the PROCESS 177 are vectorially added together as in a conventional beam forming system to form an intermediate output signal. The largest of the electrical phase difference values is then used to determine the attenuation to be applied to the intermediate output signal in a manner similar to that described in reference to FIG. 12 or 14. Once the attenuation is applied, the result is the final output signal shown in FIG. 17(*b*). Alternatively the phase expansion techniques, as described in reference to FIGS. 5 and 9 can be first applied separately to signal pairs A-B and C-D, before the four resulting phase expanded signals are then vectorially added together to produce the final output. In this manner, a range sensitive system can be realized in accordance with the invention.

As so far described with respect to linear broadside arrays, the inventive method produces an effective reduction in the width of a sensor beam produced by an array of sensors. FIG. 18 shows three different means of using the novel technology for creating a "pencil" beam—that is, a beam with both reduced azimuthal (width) and reduced elevational (height) extent. Although three different arrangements are shown, they are intended only as examples of the invention, and are not intended to be limiting.

FIG. 18(*a*) shows a four sensor method in which the signals from sensors A and B are used by a first one of the inventive processes PROCESS 181 to produce a first intermediate signal 182 representing a first effective sensitivity beam that is narrow in the X direction, but relatively wide in the Y direction. Simultaneously, the signals from sensors C and D are used by a second one of the inventive processes PROCESS 183 to produce a second intermediate signal 184 representing a second effective sensitivity beam that is narrow in the X direction, but relatively wide in the Y direction. The phase difference between the two intermediate signals 182 and 184 contains information about the elevational angle of arrival for signals that are off-axis in the Y direction. A third one of the inventive processes PROCESS 183 uses this elevational angle of arrival information contained in these two intermediate signals to produce a final output signal representing a final pencil-shaped sensitivity beam that is narrow in both the X and the Y directions.

Although relatively simple to create and understand, the pencil beam method of FIG. 18(*a*) is complex, uses a relatively high number of components and requires relatively high computational power. To reduce this cost, another pencil beam method is shown in FIG. 18(*b*). Here a three sensor array consisting of sensors A, B and C in a triangular configuration is shown. Preferably, the sensor elements are arranged in an equilateral triangle configuration, but that configuration is not a limitation for the purposes of this invention and other three sensor configurations are contemplated. The three sensor signals are used by the inventive process shown at 186. Although the phase expansion method of implementing the novel system can be used at 186, one of the attenuation processes, such as those described in connection with FIGS. 12 and 14, will be described.

First the process calculates the absolute value of the input signal electrical phase difference values for sensor signal pairs A-B, B-C and C-A. Then either the mean value of these three input signal electrical phase difference values is selected or the largest value is selected, and the resulting input signal electrical phase difference selection is used to determine the attenuation amount to be applied to the vectorial average of the three sensor signals. This attenuated vectorial average is the final output signal for the system, and it represents a beam pattern that is narrow in both the X and Y directions, as desired. Although any mathematical mean can be used, in general the average value will be desirable. This pencil beam system is significantly simpler and less costly than the four sensor system described with respect to FIG. 18(*a*). However, there is an even simpler system configuration for producing a pencil beam using the inventive technology.

FIG. 18(*c*) shows such a system. A two-sensor array is formed by sensor elements A and B configured as an end-fire array along the sensitivity axis I. By time delaying the sensor signal from the front sensor A using time delay circuit 187, the delayed signal 188 from sensor A and the direct signal from sensor B arrive at the process 189 in a time aligned manner. The process 189 is identical to any of the novel beamforming methods described above with respect to the two element broadside arrays. Due to the axial symmetry about the sensitivity axis I, this pencil beam configuration produces a sensitivity beam with restricted sensitivity in both the X and Y directions.

The inventive apparatus and method need not be used only for the creation of narrow sensitivity beams. It can also be used to increase the width of wide sensitivity beams, in other words to narrow the width of the nulls between sensitivity lobes. Such operation is valuable in a number of applications, for example in a type of beamformer system called the generalized side lobe canceller (GSC). The best known GSC is the Griffiths-Jim beamformer, originally proposed as a means to improve the performance of radio-frequency antenna systems.

In the Griffiths-Jim beamformer, the signals from the array's broadside array sensor elements are combined by 1) a first method that captures a signal combining both the desired signal and the noise, and 2) second methods whose intention is to produce different signals that are versions of the noise only. The second method signals are produced by a blocking matrix that combines the sensor signals in ways that create nulls in the direction of the desired signal. Signals from the blocking matrix are then modified by adaptive filters before being subtracted from the signal resulting from the first method so as to remove the noise from this combined signal. The result is put out as the noise reduced final signal. Feedback from this noise reduced final signal is used to adapt the adaptive filter coefficients using a least mean squared (LMS) or other adaptation method in order to minimize the residual noise in the noise reduced final signal.

Although this beamforming technique can be used with any number of array sensors greater than one, for simplicity the two-sensor example will be discussed here in reference to the application of the inventive apparatus and method. FIG. 19(*a*) shows the structure of this type of prior art two-element noise reduction system. The two-sensor broadside array 190*a* is shown with the elements A and B, and it is assumed that the desired signal is arriving from a direction along the array axis I. The input signals from the two sensors are combined in the first method by summing at circuit 191 (as in the classic delay-and-sum beamformer) the two sensor signals produced by the two array elements to generate the combined signal labeled DS. This first signal has a beam shape that varies with frequency, being a Figure-8 pattern with a maximum pointing in the direction of arrival of the desired signal when the array elements are separated by a distance of one-half wavelength, but with a nearly circular beam pattern at frequencies well below the half wavelength frequency.

The same input signals are also combined in the second method by differencing the two signals at 192, to generate the second noise-only signal labeled NS. The differencing circuit 191 is the blocking matrix for this two-element array example. The sensitivity pattern for the second signal has a Figure-8 beam shape at all frequencies, but with a null pointing directly toward the desired signal and maximum sensitivity along the orthogonal axis X. Thus, the signal DS contains both desired signal plus noise, while the second signal NS contains only noise.

The signal NS is then adaptively filtered by the filter 194, here shown as a digital finite impulse response filter (FIR). The adaptation of this filter is controlled by a least mean squared (LMS) circuit 195 that attempts to minimize the noise power in the final output signal by adjusting the filter coefficients. The output from the filter circuit is subtracted from a delayed version of the combined signal DS at 196 to provide the final noise reduced output signal. The time delay 193 is required to compensate for the time delay in the filter 194 so as to time align the combined signal DS with the noise-only signal created by the filter 194, before subtraction at 196.

In this system, the width of the null in the beam pattern of the second method signal NS determines the maximum noise reduction possible with the Griffiths-Jim beamformer, with a narrower null producing a greater possible noise reduction. However in the prior art system shown in FIG. 19(*a*), the width of the null is fixed and can not be varied, so the maximum amount of noise reduction is fixed.

If instead, as shown on FIG. 19(*b*), the blocking matrix's signal differencing circuit used in the Griffiths-Jim type beamformer is preceded with the phase enhancement process, 198 of this invention, then the width of the null in the direction of the desired signal can be reduced in proportion to the amount of phase expansion, thereby achieving an increase of the noise reduction capabilities of the Griffiths-Jim beamformer.

Another noise reduction limitation of the prior art system shown in FIG. 19(*a*) is a result of the frequency variation in beam shape for the signal DS. This variation produces a different frequency response characteristic for every angle of arrival. Thus, off-axis noise sources are "colored", and the adaptive filter must re-adapt whenever there is relative motion between the sensor array and the noise source or sources. During the time that the filter is adapting, the noise is not reduced, but is instead passed to the output.

By substituting the novel process of this invention for the first signal method 191 in FIG. 19(*a*), used to create the signal DS, the frequency variation can be eliminated, since the value of the parameter S can be adjusted to compensate for the frequency variation. This is shown in FIG. 19(*b*) by the circuit block 197. Elimination of the frequency variation of beam shape eliminates the frequency response variation caused by the relative motion of off-axis noise signals, and thereby reduces or eliminates the re-adaptation time caused by relative motion between the sensor array and noise sources.

In wideband applications, the Griffiths-Jim beamformer and many other GSC's will not operate with end-fire sensor array configurations. This limitation is due to the need to maintain, at all frequencies, a beam pattern null in the direction of the desired source for the blocking matrix signals. For example, in the system shown in FIG. 19(*a*), if the sensor array were to be configured as an end-fire array, as shown as 190*b* in FIG. 19(*c*), the signals NS and DS in FIG. 19(*a*) would be interchanged, since the first method and second method beams would be rotated by 90 degrees. However as described above, the beam pattern formed by the summation circuit 191 only has a null when the sensor elements are spaced one-half wavelength apart. Since the one half wavelength condition only occurs at a single frequency, such a system only operates correctly for frequencies at or near to that frequency. Because the circuit element 191 is producing the signal NS in this configuration, at frequencies away from the one half wavelength frequency the null disappears and some of the desired signal "leaks" into the noise canceling adaptive filter. The result is that a part of the desired signal is undesirably removed from the output signal creating distortion of the desired signal. Thus, it is possible to create an end-fire version of the conventional Griffiths-Jim beamformer, but only for very narrow bandwidth applications where the element spacing can be made equal to one-half wavelength.

If instead, for the end-fire array configuration 190*b* of FIG. 19(*c*), the noise signal NS is produced by a blocking matrix 192 consisting of the novel phase enhancement process, then the variation of the noise sensing beam pattern can be eliminated by frequency tapering of the values used for the sharpness parameter S. Thus, the null toward the desired signal can be maintained constant over frequency, as is required for correct operation of the adaptive noise reduction process of the GSC.

Similarly, the combined signal DS can be obtained in this end-fire configuration by application of the novel phase enhancement prior to a vector signal difference circuit, as is shown at 199 in FIG. 19(*c*). However the system shown in FIG. 18(*c*) could be alternatively substituted for circuit block 199 in FIG. 19(*c*) in order to produce the combined signal DS.

Most of the above described beamforming systems utilize additive beamforming methods, where the phase-enhanced signals are summed to produce the output signal. However there is another class of beamformers that use only signal differences to create the beam patterns of interest. These beamformers are called subtractive beamformers, and the simplest is the two-element end-fire array.

Phase compression, the reverse of phase expansion, can be used beneficially in subtractive beamforming array systems. For example, utilizing two omni-directional microphone elements, an acoustic end-fire beamformer is created when the rear element's signal is subtracted from the front element's signal. For example, in acoustic pickup sensor applications, the resulting beam pattern is an end-fire Figure-8, commonly called a noise canceling microphone system.

By compressing the electrical phase difference between the two input signals before subtraction, the beam pattern can be narrowed. In other words, the beam pattern is made desirably less sensitive to off-axis noise pickup. In the configuration shown in FIG. 19(*c*), the combined signal DS may be produced by first phase enhancing the sensor signals according to the innovative methods described above and then differencing those signals, as shown by circuit block 199 in FIG, 19(*c*). In this case, the phase enhancement is preferably a phase compression.

As an example of phase compression, in Equation 1, phase compression is accomplished by using values for the parameter, S, of between 0 and 1, in other words, $0 \leqq S < 1$. The curve for this particular signal phase compression characteristic is shown in FIG. 6(*a*) as graph curve 61. This curve results when the value of ½ is used for the sharpness parameter S. Many other phase compression functions and curves are possible, and it is contemplated that any such function or curve can be used within the scope of this invention without limitation. Similarly, as shown by Equation 4, there are corresponding attenuation functions and these are also contemplated to be unlimited within the scope of this invention.

Alternative to the frequency domain processing described above, the process can be applied in the time domain, wherein for example the input signal, either analog or digitized, is passed through a bank of bandpass frequency discrimination filters (either analog or digital as appropriate). The outputs of each of the frequency filters is subsequently processed, for example by using the Hilbert transform to create an analytic signal for each input signal channel. The analytic signals are then used to calculate in real-time the instantaneous phase and instantaneous phase difference as well as the instantaneous signal magnitudes, using methods that are well known in the art. The phase difference is then used to, for example, attenuate the signal magnitudes as a function of the phase difference, using any of the attenuation functions, or a look-up table, as described above, before the processed signals are then combined to form a processed output signal by adding together the processed signals. Alternatively, the instantaneous signal electrical phase difference can be enhanced using any of the enhancement functions, or a look-up table, before combining the signals to form the processed output signal by adding together the phase expanded signals.

Additionally, the novel signal matching method can be applied within such time domain processing techniques, by reassigning the individual instantaneous signal magnitudes to be the mathematical mean value of the individual signal magnitudes.

In the time domain processing technique, it is often desirable to filter the measured parameters or the processing modifications to reduce spurious effects that create noise in the process. Such filtering is contemplated to be within the scope of the invention. The above time domain methods are exemplary modes of carrying out the invention and are not intended to be limiting.

It will be appreciated that while mostly herein described in terms of audio signals from a pair of microphones arranged as a broadside array, the method and system of the invention are applicable to any number of sensor elements of all types, arranged in one, two or three dimensions. Uses of microphones, or other sound sensor elements generally, can be in vehicle cabins (telephones, command and control) for civilian and military uses, PCs, tablet PCs, PDAs, appliances, conference telephones, microphone arrays (for example, on top of PC monitors), concerts, sporting events and other large gatherings. Further, the signal enhancement aspects of the invention are equally applicable to non-audio signals, finding uses in virtually any wave energy system, for example ultrasound and infrasound systems, sonar and sonar imaging, radar and radar imaging, X-rays and X-ray imaging, underwater warfare, echo location, astronomy, medical applications, optical imaging, gravity wave detection and location, infrared applications, and so forth.

The above are exemplary modes of carrying out the invention and are not intended to be limiting. It will be apparent to those of ordinary skill in the art that modifications thereto can be made without departure from the spirit and scope of the invention as set forth in the following claims.

The invention claimed is:

1. A method for time domain processing of signals from a plurality of sensors, the method comprising:

obtaining from the plurality of sensors a plurality of corresponding input signals each representable by an input vector having phase and magnitude components;

applying each of the input signals to each filter of a bank of bandpass frequency discrimination filters, such that each filter of said bank generates a plurality of filtered signals each of which corresponds to an input signal from a sensor;

generating, for each filter, an instantaneous phase angle difference value representative of the phase angle difference between the plurality of filtered signals from that filter;

enhancing the phase component of each filtered signal by an enhancement value which is a function of the instantaneous phase angle difference value associated with that filter to thereby obtain enhanced output signals, said enhancing including attenuation of the output signals; and combining the enhanced output signals.

2. A method for time domain processing of signals from a plurality of sensors, the method comprising:

obtaining from the plurality of sensors a plurality of corresponding input signals;

applying each input signal to each filter in a bank of bandpass frequency discrimination filters to thereby obtain, from each filter, a plurality of filtered input signals each of which corresponds to an input signal;

generating, for each filter, a phase angle difference value from the filtered signals obtained from that filter; and attenuating, for each filter, each of the plurality of filtered signals by an attenuation factor which is a function of the phase angle difference values generated from that filter, to thereby obtain attenuated filtered signals; and combining the plurality of attenuated filtered signals.

3. The method of claim 2, wherein the attenuation factor is derived from a look-up table.

4. A method for time domain processing of signals from a plurality of sensors, the method comprising:

obtaining from the plurality of sensors a plurality of corresponding input signals;

applying each input signal to each filter in a bank of bandpass frequency discrimination filters to thereby obtain, from each filter, a plurality of filtered input signals each of which corresponds to an input signal;

determining, from the plurality of filtered input signals of each filter, an instantaneous phase angle difference value representative of the phase angle difference between the plurality of filtered input signals from that filter;

combining, for each filter, the plurality of filtered input signals from that filter to thereby obtain a combined filtered signal for each filter;

attenuating the combined filtered signals from each filter as a function of the instantaneous phase angle difference value to thereby obtain an attenuated combined filtered signal for each filter; and combining all the attenuated combined filtered signals.

5. A time domain processing system for processing signals from a plurality of sensors each configured to generate a input signals representable by an input vector having phase and magnitude components, the system comprising:

a filter bank having a plurality of bandpass frequency discrimination filters each configured to receive each of the input signals and to generate filtered signals at a frequency band associated with the filter;

a phase angle difference circuit configured to generate an instantaneous phase angle difference value representative of the phase angle difference between the filtered signals at each frequency band;

an enhancement circuit configured to enhance a phase component of each filtered signal at each frequency band as a function of the instantaneous phase angle difference value generated for that frequency band, said enhancement circuit generating an enhancement circuit output at each frequency band, each said output further being attenuated as a function of an associated enhanced phase component; and a combiner configured to combine all enhancement outputs from the enhancement circuit.

6. A time domain processing system for processing signals from a plurality of sensors each configured to generate an input signal representable by an input vector having phase and magnitude components, the system comprising:

a filter bank having a plurality of bandpass frequency discrimination filters each configured to receive each of the input signals and to generate filtered signals at a frequency band of the filter;

a phase angle difference circuit configured to generate an instantaneous phase angle difference value representative of the phase angle difference between the filtered signals at each frequency band;

an attenuation circuit configured to attenuate each filtered signal by an attenuation factor that is a function of the instantaneous phase angle difference value generated at the frequency band of the filter generating that filtered signal; and a combiner configured to combine the attenuated filtered signals.

7. A time domain processing system for processing signals from a plurality of sensors each configured to generate an input signal representable by an input vector having phase and magnitude components, the system comprising:

a filter bank having a plurality of bandpass frequency discrimination filters each configured to receive each of the input signals and to generate filtered input signals at a frequency band of the filter;

a phase angle difference circuit configured to generate an instantaneous phase angle difference value representative of the phase angle difference between the filtered input signals at each frequency band;

a combiner associated with each frequency band, the combiner configured to combine the plurality of filtered input signals of each frequency band to thereby obtain a combined filtered signal for each frequency band;

an attenuator configured to attenuate combined filtered input signals in each frequency band as a function of the instantaneous phase angle difference value at that frequency band; and a combiner configured to combine the attenuated combined filtered input signals.

* * * * *